(12) United States Patent
Sata

(10) Patent No.: US 10,268,289 B2
(45) Date of Patent: Apr. 23, 2019

(54) CONDUCTIVE FILM AND DISPLAY DEVICE PROVIDED WITH TOUCH PANEL

(71) Applicant: FUJIFILM Corporation, Tokyo (JP)

(72) Inventor: Hiroaki Sata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 19 days.

(21) Appl. No.: 15/406,202

(22) Filed: Jan. 13, 2017

(65) Prior Publication Data

US 2017/0131804 A1    May 11, 2017

Related U.S. Application Data

(63) Continuation of application No. PCT/JP2015/069647, filed on Jul. 8, 2015.

(30) Foreign Application Priority Data

Jul. 17, 2014   (JP) .................................. 2014-147205

(51) Int. Cl.
*G06F 3/041*     (2006.01)
*G02B 1/14*      (2015.01)
(Continued)

(52) U.S. Cl.
CPC ................ *G06F 3/041* (2013.01); *B32B 3/00* (2013.01); *B32B 7/02* (2013.01); *B32B 9/00* (2013.01); *B32B 9/007* (2013.01); *B32B 9/045* (2013.01); *B32B 23/20* (2013.01); *B32B 27/08* (2013.01); *B32B 27/20* (2013.01); *B32B 27/302* (2013.01); *B32B 27/306* (2013.01); *B32B 27/308* (2013.01); *B32B 27/325* (2013.01); *B32B 27/36* (2013.01); *G02B 1/14* (2015.01);
(Continued)

(58) Field of Classification Search
None
See application file for complete search history.

(56) References Cited

U.S. PATENT DOCUMENTS 8,314,987 B2   11/2012   Goto et al.
8,320,042 B2   11/2012   Goto et al.
(Continued)

FOREIGN PATENT DOCUMENTS

CN     1595249 A     3/2005
CN     101842317 A   9/2010
(Continued)

OTHER PUBLICATIONS

Machine-generated English-language translation of JP 2008009750A.*
(Continued)

*Primary Examiner* — Vu A Nguyen
(74) *Attorney, Agent, or Firm* — Edwards Neils, LLC; Jean C. Edwards, Esq.

(57) ABSTRACT

An object of the present invention is to provide a conductive film including a polarizer in which performance deterioration of the polarizer is suppressed while suppressing cracking of the polarizer due to a change in moisture heat environment; and a display device provided with a touch panel including the conductive film. The conductive film of the present invention includes a polarizer; and a conductive layer which is disposed on the polarizer and includes fullerene functionalized carbon nanotubes.

15 Claims, 5 Drawing Sheets

(51) Int. Cl.

| | |
|---|---|
| *G02B 5/30* | (2006.01) |
| *B32B 7/02* | (2019.01) |
| *B32B 9/00* | (2006.01) |
| *H01B 5/14* | (2006.01) |
| *H01B 1/04* | (2006.01) |
| *B32B 9/04* | (2006.01) |
| *B32B 23/20* | (2006.01) |
| *B32B 27/08* | (2006.01) |
| *B32B 27/20* | (2006.01) |
| *B32B 27/30* | (2006.01) |
| *B32B 27/32* | (2006.01) |
| *B32B 27/36* | (2006.01) |
| *B32B 3/00* | (2006.01) |
| *G06F 3/044* | (2006.01) |
| *G02F 1/1333* | (2006.01) |
| *G02F 1/1335* | (2006.01) |
| *H01L 27/32* | (2006.01) |
| *H01L 51/00* | (2006.01) |
| *H01L 51/52* | (2006.01) |
| *B29D 11/00* | (2006.01) |

(52) U.S. Cl.
CPC ......... *G02B 5/3033* (2013.01); *G02B 5/3083* (2013.01); *G06F 3/044* (2013.01); *G06F 3/0412* (2013.01); *H01B 1/04* (2013.01); *H01B 5/14* (2013.01); *B29D 11/00644* (2013.01); *B32B 2250/44* (2013.01); *B32B 2255/26* (2013.01); *B32B 2264/025* (2013.01); *B32B 2264/0235* (2013.01); *B32B 2264/0242* (2013.01); *B32B 2264/0278* (2013.01); *B32B 2264/102* (2013.01); *B32B 2264/105* (2013.01); *B32B 2307/202* (2013.01); *B32B 2307/21* (2013.01); *B32B 2307/412* (2013.01); *B32B 2307/42* (2013.01); *B32B 2457/20* (2013.01); *B32B 2457/208* (2013.01); *G02F 1/13338* (2013.01); *G02F 1/133528* (2013.01); *G02F 2202/16* (2013.01); *G02F 2202/28* (2013.01); *G06F 2203/04103* (2013.01); *H01L 27/323* (2013.01); *H01L 51/0046* (2013.01); *H01L 51/0048* (2013.01); *H01L 51/5281* (2013.01)

(56) References Cited

U.S. PATENT DOCUMENTS

| | | | |
|---|---|---|---|
| 8,379,169 B2 | 2/2013 | Kitagawa et al. | |
| 8,411,360 B2 | 4/2013 | Kitagawa et al. | |
| 8,518,726 B2 * | 8/2013 | Brown | B82Y 10/00 |
| | | | 257/103 |
| 8,520,169 B2 | 8/2013 | Kitagawa et al. | |
| 8,520,171 B2 | 8/2013 | Kitagawa et al. | |
| 8,771,454 B2 | 7/2014 | Goto et al. | |
| 8,852,374 B2 | 10/2014 | Goto et al. | |
| 2005/0260392 A1 * | 11/2005 | Sugino | G02B 5/3033 |
| | | | 428/212 |
| 2010/0329964 A1 * | 12/2010 | Roos | B82Y 10/00 |
| | | | 423/445 B |
| 2012/0055621 A1 | 3/2012 | Goto et al. | |
| 2012/0056211 A1 | 3/2012 | Kitagawa et al. | |
| 2012/0057104 A1 | 3/2012 | Kitagawa et al. | |
| 2012/0057107 A1 | 3/2012 | Kitagawa et al. | |
| 2012/0057231 A1 | 3/2012 | Goto et al. | |
| 2012/0057232 A1 | 3/2012 | Goto et al. | |
| 2012/0058321 A1 | 3/2012 | Goto et al. | |
| 2013/0016047 A1 * | 1/2013 | Masumoto | G02F 1/13338 |
| | | | 345/173 |
| 2013/0100529 A1 | 4/2013 | Kitagawa et al. | |

FOREIGN PATENT DOCUMENTS

| | | |
|---|---|---|
| JP | 2008-009750 A | 1/2008 |
| JP | 2011-505312 A | 2/2011 |
| JP | 4691205 B1 | 2/2011 |
| JP | 2013-041566 A | 2/2013 |

OTHER PUBLICATIONS

International Search Report issued in PCT/JP2015/069647 dated Oct. 6, 2015.
Notification of Reasons for Refusal issued by the Japanese Intellectual Property Office dated Aug. 29, 2017, in connection with Japanese Patent Application No. 2014-147205.
International Preliminary Report on Patentability issued by WIPO dated Jan. 26, 2017, in connection with International Patent Application No. PCT/JP2015/069647.
Office Action Issued by the State Intellectual Property Office of People's Republic of China, dated Oct. 29, 2018 in connection with Chinese Patent Application No. 201580038567.0.

* cited by examiner

CONDUCTIVE FILM AND DISPLAY DEVICE PROVIDED WITH TOUCH PANEL

CROSS-REFERENCE TO RELATED APPLICATIONS

This application is a Continuation of PCT International Application No. PCT/JP2015/069647 filed on Jul. 8, 2015, which was published under PCT Article 21(2) in Japanese, and which claims priority under 35 U.S.C. § 119(a) to Japanese Patent Application No. 2014-147205 filed on Jul. 17, 2014. The above applications are hereby expressly incorporated by reference, in their entirety, into the present application.

BACKGROUND OF THE INVENTION

1. Field of the Invention

The present invention relates to a conductive film and a display device provided with a touch panel.

2. Description of the Related Art

In recent years, touch panel functions have been provided for portable liquid crystal terminals typified by smartphones and other liquid crystal display devices. Liquid crystal display devices for which such touch panel functions are provided are mainly of external types formed by attaching a touch panel onto a liquid crystal display device in the related art.

Since a liquid crystal display device and a touch panel are separately produced and then integrated an external type thereof has a problem in that the thickness or the weight is increased.

In order to solve such a problem (the thickness or the weight) of the external type, a so-called on-cell type liquid crystal display device provided with a touch panel in which a conductive layer for a touch panel is incorporated between a liquid crystal cell and a polarizer of the liquid crystal display device (for example, JP2008-009750A) has been disclosed. JP2008-009750A discloses an embodiment in which a conductive layer for a touch panel is disposed on a polarizing plate and an indium tint oxide (ITO) layer as the conductive layer for a touch panel.

Further, due to recent demands for reduction in film thickness and cost reduction of a liquid crystal display device, a reduction in film thickness of members and a reduction in the number of members of a smart phone or the like used in small and medium-sized markets have been studied. A polarizer of the related art has a configuration in which protective films are bonded to the front and back surfaces of the polarizer, but products from which protective films on one or both surfaces are removed have been developed due to the above-described demands (for example, JP4691205B).

SUMMARY OF THE INVENTION

During production of an ITO layer, a dry process such as vacuum deposition or sputtering accompanied by a high-temperature heat treatment is employed, but warpage or decomposition of a polarizing plate and volatilization of low-molecular weight components contained in the polarizing plate easily occur and thus the transmittance or the polarization degree of the polarizing plate is easily degraded when an ITO layer is intended to be produced on the polarizer according to a dry process.

Further, as in JP4691205B, a polarizing plate from which protective films on one or both surfaces of a polarizer are removed has a problem in that cracks easily occur due to a change in moisture heat environment. Therefore, when a combination with a conductive layer for a touch panel as in JP2008-009750A is used, it is desired to suppress such problems.

The present invention has been made in consideration of the above-described circumstances, and an object thereof is to provide a conductive film including a polarizer in which performance deterioration of the polarizer is suppressed while suppressing cracking of the polarizer due to a change in moisture heat environment.

Further, another object of the present invention is to provide a display device provided with a touch panel which includes the above-described conductive film.

The present inventors conducted intensive research on the problems of the related art and found that the above-described problems can be solved using a conductive layer that includes fullerene functionalized carbon nanotubes.

That is, the present inventors found that the above-described problems can be solved by the following configuration.

(1) A conductive film comprising: a polarizer; and a conductive layer which is disposed on the polarizer and includes fullerene functionalized carbon nanotubes.

(2) The conductive film according to (1), further comprising: a hard coat layer which is disposed on the conductive layer.

(3) The conductive film according to (1) or (2), in which the sheet resistance value is in a range of 10 to 150Ω/□.

(4) The conductive film according to any one of (1) to (3), in which the thickness of the polarizer is in a range of 5 to 30 μm.

(5) The conductive film according to any one of (1) to (4), further comprising: a λ/4 plate which is disposed between the polarizer and the conductive layer.

(6) The conductive film according to any one of (1) to (5), further comprising: a protective film which is disposed on the surface of the polarizer on the opposite side to the conductive layer side.

(7) The conductive film according to any one of (1) to (6), which is used for a touch panel.

(8) A display device provided with a touch panel comprising: the conductive film according to (7).

According to the present invention, it is possible to provide a conductive film including a polarizer in which performance deterioration of the polarizer is suppressed while suppressing cracking of the polarizer due to a change in moisture heat environment.

Further, according to the present invention, it is possible to provide a display device provided with a touch panel which includes the above-described conductive film.

DESCRIPTION OF THE PREFERRED EMBODIMENTS

Figure 1:
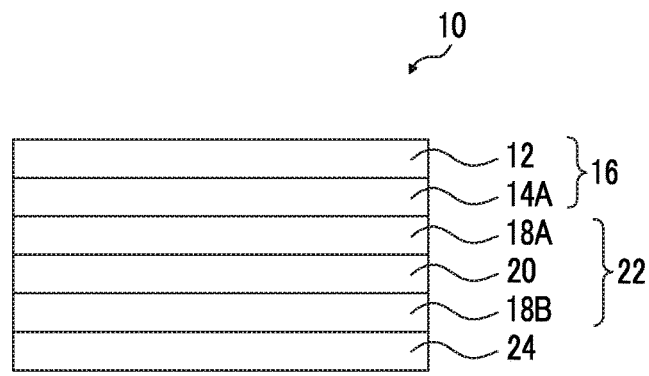
FIG. 1 is a sectional view schematically illustrating a liquid crystal display device provided with a touch panel according to a first embodiment of the present invention.

Hereinafter, a conductive film and a display device provided with a touch panel of the present invention will be described in detail.

In the present specification, the numerical ranges shown using "to" indicate ranges including the numerical values described before and after "to" as the lower limits and the upper limits. Moreover, the views of the present invention are schematic views and the relationships in thickness of each layer or positional relationships do not necessarily coincide with the actual ones.

One feature point of the conductive film of the present invention is that a conductive layer containing fullerene functionalized carbon nanotubes is used. As described later in detail, fullerene functionalized carbon nanotubes includes one or plural fullerenes and/or fullerene-based molecules covalently bonded to carbon nanotubes. A fullerene functionalized carbon nanotube is a material that has mechanical flexibility derived from carbon nanotubes and exhibits excellent conductivity more than carbon nanotubes as a result of adding a fullerene functional group. In the conductive layer, a network structure is easily formed while fullerene functionalized carbon nanotubes are entangled with each other, and a fullerene functional group comes into contact with a fullerene functionalized carbon nanotube adjacent to the fullerene functional group to obtain a conductive layer exhibiting excellent conduction characteristics.

Moreover, as described later, when a conductive layer containing fullerene functionalized carbon nanotubes is prepared, high temperature vacuum conditions are not required. Accordingly, compared to a case where an ITO film is prepared by a dry process, performance degradation of a polarizer can be suppressed.

In addition, as described above, cracks easily occur in the polarizer which does not have a protective film on one or both sides due to the moisture heat environment. One main reason is that the polarizer is repeatedly swollen or contracted due to a change in moisture heat environment. On the contrary, since fullerene functionalized carbon nanotubes are entangled with each other in the conductive layer, the conductive layer itself is unlikely to be swollen or contracted. Accordingly, it is assumed that the swelling and contracting of the polarizer are suppressed and thus occurrence of cracks of the polarizer is suppressed when such a conductive layer and the polarizer are combined with each other.

In other words, it is possible to dispose the conductive layer containing the fullerene functionalized carbon nanotubes on the polarizer while suppressing performance deterioration of the polarizer and to suppress occurrence of cracks of the polarizer due to a change in moisture heat environment.

The conductive film of the present invention includes at least a polarizer and a conductive layer which is disposed on the polarizer and contains fullerene functionalized carbon nanotubes.

Hereinafter, members (the polarizer and the conductive layer) included in the conductive film will be described in detail.

<Polarizer>

The polarizer may be a member having a function of converting light into specific linearly polarized light and an absorptive type polarizer or a reflective type polarizer can be used.

Examples of the absorptive type polarizer include an iodine-based polarizer, a dye-based polarizer using a dichroic dye, and a polyene-based polarizer. A coating type polarizer and a stretching type polarizer may be exemplified as the iodine-based polarizer and the dye-based polarizer and both can be used, but a polarizer prepared by adsorbing iodine or a dichroic dye to polyvinyl alcohol to be stretched is preferable.

Further, examples of a method of obtaining a polarizer by performing stretching and dyeing in a state of a laminated film having a polyvinyl alcohol layer formed on a base include methods described in JP5048120B, JP5143918B, JP4691205B, JP4751481B, and JP4751486B, and a known technique related to these polarizers can be preferably used.

Examples of the reflective type polarizer include a polarizer formed by laminating a thin film having a different film birefringence, a wire grid type polarizer, and polarizer obtained by combining a cholesteric liquid crystal having a selective reflection range with a quarter wavelength plate.

Among these, from the viewpoint of more excellent adhesiveness to the conductive layer described below, a polarizer including a polyvinyl alcohol-based resin (particularly, at least one selected from the group consisting of polyvinyl alcohol and an ethylene-vinyl alcohol copolymer) is preferable.

The thickness of the polarizer is not particularly limited, but is preferably 35 µm or less, more preferably in a range of 3 to 30 µm, still more preferably in a range of 5 to 30 µm, and particularly preferably in a range of 5 to 20 µm, from the viewpoint of reducing the thickness of a display device.

In addition, the thickness thereof is an average value obtained by measuring the thicknesses of arbitrary 10 points of the polarizer and arithmetically averaging the values.

<Conductive Layer>

The conductive layer contains fullerene functionalized carbon nanotubes. The fullerene functionalized carbon nanotubes will be described below.

The content of fullerene functionalized carbon nanotubes in the conductive layer is not particularly limited, but is preferably 60% by mass or greater, more preferably 80% by mass or greater, and still more preferably 90% by mass with respect to the total mass of the conductive layer, from the viewpoints that cracks of the polarizer due to a change in moisture heat environment are further suppressed (hereinafter, simply also referred to as "from the viewpoint of more excellent effects of the present invention") and/or the conductivity of the conductive layer is more excellent. The upper limit thereof is not particularly limited, but is typically 100% by mass.

Further, the conductive layer may contain additives other than the fullerene functionalized carbon nanotubes and the content thereof is not particularly limited, but is preferably in a range of 0.01% to 40% by mass, more preferably in a range of 0.1% to 20% by mass, and still more preferably in a range of 0.1% to 10% by mass with respect to the total mass of the conductive layer from the viewpoints of more excellent effects of the present invention and/or more excellent conductivity of the conductive layer.

The thickness of the conductive layer is not particularly limited, but is preferably in a range of 0.1 to 15 µm and more preferably in a range of 1 to 10 µm from the viewpoints of more excellent effects of the present invention and/or more excellent conductivity of the conductive layer. Further, the thickness thereof is an average value obtained by measuring the thicknesses of arbitrary 10 points of the conductive layer and arithmetically averaging the values.

The conductive layer may be disposed on the entire surface (main surface) of the polarizer or on a region which is a part of the surface of the polarizer. Particularly, in a case where the conductive layer is applied to a touch panel as described below, it is preferable that the conductive layer is disposed in a predetermined pattern.

A method of preparing a conductive layer is not particularly limited as long as a conductive layer containing fullerene functionalized carbon nanotubes is prepared, and examples thereof include a method of allowing fullerene functionalized carbon nanotubes to be dispersed in a solvent to be applied onto a polarizer and performing a drying treatment as needed and a method of blowing aerosols containing fullerene functionalized carbon nanotubes to a polarizer.

Moreover, other than a method of preparing a conductive layer directly on a polarizer, a method of preparing a conductive layer containing fullerene functionalized carbon nanotubes on a temporary support and transferring the conductive layer onto a polarizer may be exemplified.

As described above, the conductive layer may be disposed in a predetermined pattern.

A method of forming a conductive layer in a predetermined pattern is not particularly limited, and examples thereof include a method of depositing a conductive layer containing fullerene functionalized carbon nanotubes on a support (for example, a polarizer or a temporary support) on which a mask is provided in a predetermined pattern and removing the mask to obtain a conductive layer having a predetermined pattern; a method of preparing a resist having a predetermined pattern on a conductive layer and performing etching through a wet process using a strong acid, a chemical agent having excellent oxidizability or corrosivity, and a strong alkali; and a method of patterning a conductive layer through screen printing. In the present invention, it is preferable that the conductive layer is patterned by a dry etching process.

An example thereof is described below, but the present invention is not limited thereto.

An aluminum film which becomes a mask is formed on a conductive layer and then the aluminum film is coated with a resist for forming a pattern. Next, the resist together with a pattern are exposed to light and developed. Subsequently, the aluminum film is etched using the patterned resist as a mask. Next, the resist is peeled off. Further, the conductive layer exposed to the surface is burned for removal using a dry etching device, for example, an $O_2$ plasma ashing device. Here, the burning is used for a method of oxidizing using an $O_2$ plasma and a radical activated without increasing the substrate temperature as well as a case where the sample temperature is increased, that is, the burning includes ashing. Finally, the conductive layer can be patterned by removing the aluminum film on the conductive layer through wet etching using phosphoric acid, particularly, heated phosphoric acid.

Moreover, the dry etching has been described using $O_2$ plasma ashing, but etching can be carried out using other dry etching methods such as sputtering etching, chemical etching, reactive etching, reactive sputtering etching, ion beam etching, and reacting ion beam etching.

Gas etching or radical-containing etching is chemical etching or reactive etching and is capable of removing nanoparticles mainly containing fullerene functionalized carbon nanotubes or carbon using reactive gas such as oxygen or hydrogen which reacts with carbon and can be removed. The carbon bonds of fullerene functionalized carbon nanotubes, carbon nanoparticles, or amorphous carbon covering a catalytic metal surface are formed of 6-membered rings or 5-membered rings, but the carbon bonds of carbon nanoparticles or amorphous carbon covering a catalytic metal surface are incomplete compared to fullerene functionalized carbon nanotubes so that the amount of 5-membered rings is larger and easily react with reactive gas.

Accordingly, in a case where a conductive layer containing carbon nanoparticles or fullerene functionalized carbon nanotubes that include amorphous carbon covering the catalytic metal surface is patterned, gas etching or radical-containing etching is more effective. Further, since gas etching or radical-containing etching is isotropic etching, reactive gas runs around not only the surface of nanotubes to be patterned but also the side wall or back surface of nanotubes and nanoparticles in the vicinity of the surface and selectively reacts with carbon so that the portion other than catalytic metal can be rapidly removed. In addition, a conductive layer containing fullerene functionalized carbon nanotubes that include nanoparticles can be patterned by adding a process of removing only the catalytic metal. For example, in a case where the reaction product is oxygen, the reaction product becomes gas such as CO or $CO_2$ and thus does not re-adhere to the support. Therefore, there is no problem of surface contamination. Particularly, the burning using oxygen is simply carried out, which is preferable.

Next, a case of using ionic sputtering effects is considered. For example, aluminum is covered on a conductive layer which is intended to be left at the time of patterning using sputtering or vapor deposition, but aluminum is unlikely to be sufficiently covered particularly in the inside of a concave in a case where the surface of the conductive layer is significantly uneven. In a case of using reactive gas, gas runs around and the conductive layer is etched from a portion in which a protective film is not sufficiently covered in a case where the etching time is long. Meanwhile, since the straightness of ion species is strong and the ion species enter from the upper surface in a case of using ionic sputter etching, it is difficult to damage the conductive layer positioned below the thick covered film. Further, because of anisotropic etching, etching can be made reliably and vertically to the mask pattern. Therefore, this is preferable for removing the conductive layer containing fullerene functionalized carbon nanotubes in which nanoparticles do not contain catalytic metal and also preferable for forming a fine pattern.

In ion beam etching or reactive ion beam etching, etching can be performed without mask, but modulation of beams and the process time per area are required. Further, a small-sized display is suitable here than a large area display.

Further, the example using an aluminum film as a mask during the above-described $O_2$ plasma ashing has been described, metals, such as titanium, gold, molybdenum, tungsten, and silver, which do not damage the conductive layer during the removal of the conductive layer may be used. The conductive layer can be rapidly removed by a mixed solution of titanium and nitric acid, gold and aqua regia, molybdenum and hot-concentrated sulfuric acid or aqua regia, or tungsten and hydrofluoric acid or nitric acid. However, since the conductive layer is gradually degraded when nitric acid, sulfuric acid, and hydrogen fluoride are used during a long-time process, it is necessary to perform the process, particularly, under conditions of the temperature and the concentration in a predetermined time, which are not damaged. The process can be performed without damage by carrying out the process at room temperature in one hour using 65% of nitric acid, 90% of sulfuric acid, 45% of hydrogen fluoride, and a mixture of these. Aluminum is preferred than other metals since aluminum is inexpensive compared to other metals and is in a state of the conductive layer being covered, in which aluminum crystal grains are dense and the coverage is high, and the conductive layer is not degraded with respect to phosphoric acid which is an etching solution.

Meanwhile, a metal with a large atomic weight has a small sputtering rate due to ions and is suitable as a mask material in a case of dry etching mainly having sputtering effects. Particularly, gold, tungsten, and molybdenum have resistance at least two times the resistance of aluminum of titanium and thus are unlikely to be damaged immediately below a mask. Therefore, it is preferable that the conductive layer containing fullerene functionalized carbon nanotubes in which nanoparticles do not contain catalytic metal is removed and the removal is preferable for forming a fine pattern.

Moreover, other than metals, silicon dioxide or aluminum oxide which is not damaged by $O_2$ plasma ashing and does not damage the conductive layer during the removal can be used.

(Fullerene Functionalized Carbon Nanotubes)

The fullerene functionalized carbon nanotubes (in the present specification, also referred to as CBFFCNT) include one or plural fullerenes and/or fullerene-based molecules covalently bonded to carbon nanotubes. That is, CBFFCNT is a carbon nanotube in which one or plural kinds selected from the group consisting of fullerenes and fullerene-based molecules are introduced through a covalent bond.

Further, a carbon nanotube is a substance in which a six-membered ring network (graphene sheet) resulting from carbon atoms is turned into a coaxial tubular monolayer or multilayer. A carbon nanotube may be configured of only carbon atoms or may include carbon atoms and one or plural kinds of other atoms (for example, heteroatoms). A carbon nanotube may have a cylindrical or tubular structure whose end is open and/or closed. Moreover, a carbon nanotube may have other kinds of carbon nanotube structures.

A fullerene is a molecule which includes carbon atoms and has a substantially spherical, oval, or ball-like structure. A fullerene may have a hollow structure whose surface is closed or a substantially spherical structure whose surface is not completely closed and which has one or plural open bonds. A fullerene may have a substantially hemispheric shape and/or a shape of another arbitrary sphere.

Fullerene-based molecules are any of the above-described fullerenes, one or plural carbon atoms in a molecule are one or plural atoms other than carbon atoms (for example, heteroatoms), molecules, molecules substituted with groups and/or compounds, or the above-described fullerene molecules; one or plural additional atoms (for example, heteroatoms), molecules, molecules in which groups and/or compounds are incorporated in fullerenes, or the above-described fullerenes; or one or plural additional atoms (for example, heteroatoms), molecules, or molecules in which groups and/or compounds adhere to the surface of fullerenes.

In addition, the point in which one or plural other fullerenes can adhere to the surface of carbon nanotubes may be mentioned, but this is a simply one non-limiting example.

One or plural fullerenes and/or fullerene-based molecules can be covalently bonded to the outer surface and/or inner surface of carbon nanotubes, preferably the outer surface thereof. The fullerenes and/or fullerene-based molecules may contain 20 to 1000 atoms. The fullerene and/or fullerene-based molecules may be covalently bonded to carbon nanotubes through one or plural crosslinking atomic groups or may be covalently bonded directly to carbon nanotubes.

The crosslinking atomic groups indicate arbitrary atoms, elements, molecules, groups, and/or compounds used to allow fullerenes and/or fullerene-based molecules to be covalently bonded to carbon nanotubes. Preferred crosslinking atomic groups may include arbitrary elements of Group IV, Group V, and Group VI of the periodic table of elements. The preferred crosslinking atomic groups may include oxygen, hydrogen, nitrogen, sulfur, an amino group, a thiol group, an ether group, an ester group, and/or a carboxylic acid group, and/or other arbitrary preferred groups, and/or derivatives thereof. The preferred crosslinking atomic groups may include a carbon-containing group.

Further, as described above, as another option or in addition to the above-described options, the fullerenes and/or fullerene-based molecules may be covalently bonded directly to carbon nanotubes. For example, the fullerenes and/or fullerene-based molecules may be covalently bonded directly thereto through one or plural carbon bonds.

Carbon nanotubes may include single-wall, double-wall, or multi-wall carbon nanotubes or composite carbon nanotubes. Carbon nanotubes can be blended in a dispersion of a gas, a liquid, and/or a solid, a solid structure, powder, paste, and/or a colloidal suspension, and/or can be precipitated on the surface, and/or can be synthesized.

The fullerene functionalized carbon nanotubes can be bonded to one or plural carbon nanotubes and/or fullerene functionalized carbon nanotubes through one or plural fullerenes and/or fullerene-based molecules. In other words, for example, two fullerene functionalized carbon nanotubes can adhere to each other through common fullerene molecules.

(Method of Producing Fullerene Functionalized Carbon Nanotubes)

A method of producing one or plural fullerene functionalized carbon nanotubes includes allowing one or plural catalyst particles, carbon sources, and/or reagents to come into contact with each other to be heated in a reactor and producing one or plural carbon nanotubes containing one or plural fullerenes and/or fullerene-based molecules covalently bonded to one or plural carbon nanotubes.

A step of allowing one or plural catalyst particles, carbon sources, and/or reagents to come into contact with each other can be performed according to an arbitrary suitable method (for example, mixing) of bringing those into contact with each other. It is preferable that this method is performed in a reactor. In this manner, one or plural fullerene functionalized carbon nanotubes are produced.

The fullerene functionalized carbon nanotubes can be produced in a gas phase such as an aerosol and/or on a base. Further, this method may be carried out by a continuous flow, a batch process, or a combination of a batch sub-process and a continuous sub-process.

When the fullerene functionalized carbon nanotubes are produced, various carbon-containing materials can be used as carbon sources. Further, a carbon-containing precursor that forms a carbon source can be used. A carbon source can be selected from the group consisting of one or plural alkanes, alkenes, alkynes, alcohols, aromatic hydrocarbons, and arbitrary other suitable groups, compounds, and materials. Further, a carbon source can be selected from the group consisting of carbon compounds of a gas (methane, ethane, propane, ethylene, acetylene, carbon monoxide, and the like), volatile carbon sources of a liquid (benzene, toluene, xylene, trimethylbenzene, methanol, ethanol, octanol, and the like), other arbitrary suitable compounds, and derivatives thereof. Thiophene can be also used as a carbon source. Among these, carbon monoxide gas is preferable as a carbon source.

Carbon sources can be used alone or in plural kinds thereof.

In a case where a carbon precursor is used, the carbon precursor can be activated at a desired location in a reactor using a heated filament or plasma.

According to one embodiment, one or plural carbon sources function as one or plural catalyst particle sources, reagents, reagent precursors, and/or additional reagents.

5 to 10000 ccm and preferably 50 to 1000 ccm of a carbon source can be introduced into a reactor at a rate of approximately 300 ccm. The pressure of various materials (for example, carbon sources) used for this method can be set to be in a range of 0.1 to 1000 Pa and preferably in a range of 1 to 500 Pa.

One or plural reagents can be used for producing fullerene functionalized carbon nanotubes. A reagent may be an etching agent. A reagent can be selected from the group consisting of hydrogen, nitrogen, water, carbon dioxide, nitrous oxide, nitrogen dioxide, and oxygen. Further, a reagent can be selected from organic and/or inorganic oxygen-containing compounds (ozone ($O_3$) and the like) and various hydrides. One or plural reagents used for this method can be selected from carbon monoxide, octanol, and/or thiophene.

A preferable reagent (one or plural kinds) is water vapor and/or carbon dioxide. Further, other arbitrary suitable reagents can be used for the method of the present invention. Other reagents and/or reagent precursors can be used as carbon sources. On the contrary, carbon sources can be used as reagents and/or reagent precursors. Examples of such reagents include ketone, aldehyde, alcohol, ester, and/or ether, and/or other arbitrary suitable compounds.

One or plural reagents and/or reagent precursors can be introduced into a reactor together with or separately from carbon sources. One or plural reagents and reagent precursors can be introduced into a reactor at a concentration of 1 to 12000 ppm and preferably 100 to 2000 ppm.

The concentration of one or plural fullerenes and/or fullerene-based molecules covalently bonded to carbon nanotubes. The concentration thereof can be adjusted by adjusting the amount (for example, the concentration) of one or plural reagents being used, adjusting the heating temperature, and/or adjusting the retention time. The adjustment is performed according to a synthesis method. The heating can be performed at a temperature of 250° C. to 2500° C. and preferably 600° C. to 1000° C. For example, in a case where $H_2O$ and $CO_2$ are used as reagents, the concentration of a reagent in a case of water can be set to be in a range of 45 to 245 ppm and preferably in a range of 125 to 185 ppm and the concentration of a reagent in a case of $CO_2$ can be set to be in a range of 2000 to 6000 ppm and preferably approximately 2500 ppm. In this manner, the fullerene density higher than 1 fullerene/nm can be set. Even at a specific concentration of one or plural reagents, it is possible to find an optimum range of the heating temperature.

Various catalyst materials (catalyst particles) that catalyze decomposition and disproportionation of carbon sources can be used.

Catalyst particles being used may contain, for example, various metals and/or non-metallic materials. Preferable catalyst particles contain one metal and preferably one transition metal and/or metals (plural kinds) and/or a combination of transition metals (plural kinds). It is preferable that catalyst particles contain iron, cobalt, nickel, chromium, molybdenum, palladium, and/or other arbitrary similar elements. The catalyst particles can be formed by thermal decomposition of ferrocene vapor from a chemical precursor (for example, ferrocene). The catalyst particles can be produced by heating a metal or a metal-containing material.

The catalyst particles and the catalyst precursor can be introduced into a reactor at a ratio of 10 to 10000 ccm and preferably 50 to 1000 ccm (for example, approximately 100 ccm).

The catalyst particles used for the method of the present invention can be produced using various methods. Examples of such methods include chemical vapor decomposition of a catalyst precursor and physical vapor nucleation. Further, as other methods, catalyst particles can be produced from liquid droplets formed from a metal salt solution and a colloidal metal nanoparticle solution using electrospray, ultrasonic spray, or air spray or can be produced using thermal drying and decomposition, and/or other arbitrary applicable methods, and/or processes, and/or materials. Other arbitrary procedures for producing particles, for example, adiabatic expansion in a nozzle, arc discharge, and/or an electrospray system can be used to form catalyst particles. A hot wire generator can be used to produce catalyst particles. According to the present invention, other means for heating and/or evaporating a mass containing a metal used to generate metal vapor can be used.

The catalyst particles can be synthesized in advance and then can be introduced into a reactor. However, since particles having a particle size range required for production of CBFFCNT are difficult to handle and/or store, it is preferable that particles are produced in the vicinity of the reactor as an integrating step in the producing process.

Aerosols and/or catalyst particles carrying the surface can be used to produce fullerene functionalized carbon nanotubes. A catalyst particle precursor can be used to produce catalyst particles.

In a case of producing fullerene functionalized carbon nanotubes carrying a base, catalyst particles can be directly produced on the base and can be precipitated from a gas phase due to diffusion, thermophoresis, electrophoresis, inertial impaction, and/or other arbitrary means.

In a case of a chemical production method of catalyst particles, a metal organic compound, an organic metal compound, and/or an inorganic compound such as a metallocene compound, a carbonyl compound, a chelate compound, and/or other arbitrary suitable compounds can be used as a catalyst precursor.

In a case of a physical production method of catalyst particles, for example, a pure metal or an alloy thereof is evaporated using resistance heating, induction heating, plasma heating, conductive heating, or radiative heating, or various energy sources such as a chemical reaction (here, the concentration of generated catalyst vapor is lower than the level required for nucleation at a location of release) and then nucleation, condensation, and/or coagulation can be made from supersaturated vapor. As means for generating supersaturated vapor leading to formation of catalyst particles in the physical method, gas cooling using convective heat transfer, conductive heat transfer, and/or radiant heat transfer, and/or adiabatic expansion (for example, in a nozzle) in the periphery of a wire which is resistance-heated may be exemplified.

In a case of a thermal decomposition production method of catalyst particles, for example, various metals and/or other arbitrary suitable materials of inorganic salts such as nitrate, carbonate, a chloride, and/or a fluoride.

The method of present invention may further include a step of introducing one or plural additional reagents. Additional reagents are used to promote formation of carbon nanotubes, change the decomposition rate of carbon sources, react with amorphous carbon during and/or after production of carbon nanotubes, and/or react with carbon nanotubes (for example, for purification of carbon nanotubes, doping, and/or further functionalization). Additional reagents used to associate with chemical reactions with catalyst particle precursors, catalyst particles, carbon sources, amorphous carbon, and/or carbon nanotubes (to which one or plural fullerene and/or fullerene-based molecules are covalently bonded) can be used according to the present invention. One or plural additional reagents can be introduced together with or separately from carbon sources.

As accelerators (that is, additional reagents) for forming CBFFCNT of the present invention, additional reagents such as sulfur, phosphorus, and/or nitrogen elements, and/or compounds of these (thiophene, $PH_3$, $NH_3$, and the like) can be used. The additional accelerator reagents can be selected from $H_2O$, $CO_2$, NO, and/or arbitrary other suitable elements, and/or compounds.

In some cases, during a purification process, for example, undesirable amorphous carbon coating and/or catalyst particles encapsulated in CBFFCNT are required to be removed. In this present invention, it is possible to provide one or plural separate reactors to be heated and reactor sections and one reactor or one section of the reactor is used to produce CBFFCNT, and the rest (one or plural) are used for further purification, further functionalization, and/or doping. The above-described steps may be combined with each other.

As chemical materials for removing amorphous carbon, an arbitrary compound, a derivative of the compound, and/or a decomposition product of the compound (formed in a reactor instantly) can be used and the chemical substance does not react with graphite carbon but with preferably amorphous carbon. As examples of such reagents, one or plural alcohols, ketones, organic acids, and/or inorganic acids can be used. Further, oxidants such as $H_2O$, $CO_2$, and/or NO can be used. According to the present invention, other additional reagents can be also used.

According to one embodiment, one or plural additional reagents can be used for further functionalization of CBFFCNT. The properties of CBFFCNT to be produced are changed by chemical groups and/or nanoparticles adhering to CBFFCNT. When CBFFCNT is doped by boron, nitrogen, lithium, sodium, and/or potassium elements, the conductivity of CBFFCNT is changed. That is, CBFFCNT having superconductivity is obtained. When carbon nanotubes are functionalized by fullerenes, further functionalization of carbon nanotubes becomes possible due to the adhering fullerenes. In the present invention, when appropriate reagents are introduced before, during, and/or after formation of CBFFCNT, functionalization and/or doping can be performed instantly.

According to one embodiment, one or plural additional reagents can be used as carbon sources, carrier gas, and/or catalyst particle sources.

According to one embodiment, this method further includes a step of producing fullerene functionalized carbon nanotube composite materials by introducing one or plural additives into a reactor. For example, one or plural additives can be used to be applied to CBFFCNT and/or to be mixed with CBFFNCT to produce a CBFFCNT composite material. An object of the additive is to increase catalyst efficiency of CBFFCNT adhering to a matrix and/or to control properties the matrix (hardness, stiffness, chemical reactivity, optical characteristics, and/or thermal conductivity, and/or electrical conductivity, and/or an expansion coefficiency). As coating or aerosolized particle additives for a CBFFCNT composite material, preferably, one or plural metal-containing material, and/or organic materials (polymer and the like), and/or ceramics, solvents, and/or aerosols of these can be used. According to the present invention, other arbitrary suitable additives can be used.

For example, the obtained composite material can be directly recovered, adhere to a matrix, and/or adhere to the surface. This can be carried out using electric force, thermophoretic force, inertial force, diffusing force, turbophoretic force, gravity, and/or other suitable forces to form a thick film or a thin film, yarn, a structural body, and/or a layered material. CBFFCNT can be coated with one or more solids or liquids to be added and/or solids or liquid particles to form a CBFFCNT composite material.

The additive is mixed and aggregated in a gas phase to adhere to the surface of CBFFCNT as a surface coating using condensation of supersaturated vapor, a chemical reaction with a layer having adhered in advance, a doping agent, and/or a functional group, and/or other means, alternatively, in a case where the additive is in the form of particles. Further, it is possible to combine adhesion of gas and particles to CBFFCNT.

According to one embodiment, if necessary, one or plural carrier gases can be used to introduce the above-described materials into a reactor. If desired, the carrier gases may function as carbon sources, catalyst particle sources, reagent sources, and/or additional reagent sources.

According to one embodiment, this method further includes a step of recovering produced one or plural fullerene functionalized carbon nanotubes and/or fullerene functionalized carbon nanotube composite materials as a solid, a liquid, a dispersion of gas, a solid structure, powder, paste, a colloidal suspension, and/or a surface deposit.

According to one embodiment, this method further includes a step of allowing a dispersion of produced fullerene functionalized carbon nanotubes and/or fullerene functionalized carbon nanotube composite material, for example, a gas dispersion to adhere to the surface, and/or a matrix, and/or a layered structure, and/or a device.

The adhesion of the synthesized material is controlled by various means (inertial impaction, thermophoresis, and/or movement in an electric field, but not limited to these) so that the material is formed in a desired shape (for example, yarn, points, or a three-dimensional structure) with desirable properties such as electrical conductivity and/or thermal conductivity, opacity and/or mechanical strength, and hardness and/or ductility. Examples of means for controlling adhesion of the synthesized material include gravitational settling, fiber and barrier filtration, inertial impaction, thermophoresis, and/or movement in an electric field, which form the material in a desired shape (for example, yarn, points, or a film) with desirable properties such as electrical conductivity and/or thermal conductivity, opacity and/or mechanical strength, and hardness and/or ductility, but the means is not limited to these.

Hereinafter, a device used to produce one or plural fullerene functionalized carbon nanotubes will be described. This device includes a reactor used for heating one or plural catalyst particles, carbon sources, and/or reagents, and the heating is performed to produce one or plural carbon nanotubes containing one or plural fullerene and/or fullerene-based molecules covalently bonded to one or plural carbon nanotubes.

Such a device may further includes one or more selected from means for producing catalyst particles; means for introducing one or plural catalyst particles; means for introducing one or plural catalyst particle precursors; means for introducing one or plural carbon sources; means for introducing one or plural carbon source precursors; means for introducing one or plural reagents; means for introducing one or plural reagent precursors; means for introducing one or plural additional reagents; means for introducing one or plural additives; means for recovering one or plural produced fullerene functionalized carbon nanotubes and/or fullerene functionalized carbon nanotube composite materials; means for adhering a dispersion (for example, a gas dispersion) of produced fullerene functionalized carbon nanotubes and/or carbon nanotube composite materials; means for producing catalyst particles; and/or means for supplying energy to a reactor. For example, the means used to introduce the above-described various materials to other arbitrary portions of the reactor and/or the device may include one same means or various means. For example, according to one embodiment of the present invention, one or plural carbon sources and reagents can be introduced into the reactor using one same means. Further, if necessary, the device may include mixing means in the reactor.

The device may include one or plural reactors and, accordingly, it is possible to carry out continuous production and/or batch production of composite materials of CBFFCNT, further functionalized CBFFCNT, doped CBFFCNT, and/or CBFFCNT of these. The reactors are configured in series and/or juxtaposition so that various final compositions can be obtained. Further, the reactors can be operated by complete batch procedures or partial batch procedures.

The reactor may include a tube having ceramic materials, iron, stainless steel, and/or other arbitrary suitable materials. In one embodiment of the present invention, the surface of the reactor may be formed to include materials used to catalytically produce one or plural reagents required for production of CBFFCNT from one or plural reagent precursors introduced into the reactor (for example, in the upstream).

In one embodiment, the internal diameter of the tube can be set to be in a range of, for example, 0.1 to 200 cm and preferably in a range of 1.5 to 3 cm and the length of the tube can be set to be in a range of, for example, 1 to 2000 cm and preferably in a range of 25 to 200 cm. Other arbitrary dimensions (for example, those used for industrial usage) can be applied.

In a case of using the device of the present invention, the operating pressure in the reactor can be set to be in a range of, for example, 0.1 to 10 atm and preferably in a range of 0.5 to 2 atom (for example, approximately 1 atm). Further, the temperature in the reactor can be set to be in a range of, for example, 250 to 2500° C. and preferably in a range of 600° C. to 1000° C.

The means for producing catalyst particles may include a pre-reactor. This means may include a hot wire generator. The device may further include other arbitrary suitable means for producing catalyst particles. This means can be separated from the reactor at a distance. Alternatively, this means may be used as a part incorporated in the reactor. In a case of using the device of the present invention, the means for producing catalyst particles can be placed at a position in which the temperature of the reactor is in a range of 250° C. to 2500° C. and preferably in a range of 350° C. to 900° C.

According to one preferred embodiment, for example, a flow passing through a pre-reactor (for example, a hot wire generator) is a mixture of, preferably, hydrogen and nitrogen and the rate of hydrogen here is preferably in a range of 1% to 99%, more preferably in a range of 5 to 50%, and most preferably approximately 7%. The flow rate, for example, the flow rate passing through the hot wire generator can be set to be in a range of 1 to 10000 ccm and preferably in a range of 250 to 600 ccm.

According to the present invention, it is possible to promote and/or inhibit the chemical reaction and/or CBFFCNT synthesis using various energy sources. Examples thereof include a reactor heated by resistance, conduction, radiation, and/or atomic power, and/or the chemical reaction and/or a pre-reactor, but the examples are not limited to these. Other energy sources can be used as a reactor and/or a pre-reactor. For example, induction heating using a high frequency, a microwave, sound, or a laser and/or any other energy sources (chemical reaction and the like) can be used.

<Other Members>

The above-described conductive film may include members other than the polarizer and the conductive film. Hereinafter, arbitrary constituent members will be described in detail.

<Hard Coat Layer>

The conductive film of the present invention may include a hard coat layer on the conductive layer (on the surface of the conductive layer on the opposite side to the polarizer side) as a functional layer.

In the present invention, the hard coat layer is a layer in which the pencil hardness of the conductive film is increased by being formed. Practically, the pencil hardness (JIS K5400) of the conductive film after the hard coat layer is laminated is preferably H or greater, more preferably 2H or greater, and most preferably 3H or greater.

The thickness of the hard coat layer is preferably in a range of 0.4 to 35 μm, more preferably in a range of 1 to 30 μm, and still more preferably in a range of 1.5 to 20 μm.

The hard coat layer may be a single layer or multiple layers. In a case where a plurality of hard coat layers are present, it is preferable that the total film thickness of all hard coat layers is in the above-described range.

The surface of the hard coat layer of the conductive film according to the present invention may be flat or uneven. Moreover, if necessary, the hard coat layer may contain light-transmitting particles for improving surface unevenness or providing internal scattering.

A method of forming a hard coat layer is not particularly limited, and a known method may be employed. Typically, a method of coating the conductive layer with a composition for forming a hard coat layer which contains a predetermined component and performing a curing treatment (for example, a heat treatment and/or a light irradiation treatment) as needed.

An embodiment of the composition for forming a hard coat layer will be described later.

A known coating method can be employed as the coating method. Examples thereof include gravure coating, roll coating, reverse coating, knife coating, die coating, lip coating, doctor coating, extrusion coating, slide coating, wire bar coating, curtain coating, extrusion coating, and spinner coating.

After the conductive layer is coated with the composition for forming a hard coat layer, if necessary, a drying treatment may be performed to the layer coated with the composition in order to remove a solvent. The method of the drying treatment is not particularly limited, and examples thereof include an air drying treatment and a heat treatment.

A method of polymerizing and curing the layer coated with the composition obtained by the above-described coating is not particularly limited, and examples thereof include a heat treatment and a light irradiation treatment.

The conditions for the heat treatment vary depending on the material to be used, but it is preferable that the heat treatment is performed at 40° C. to 200° C. (preferably in a range of 50° C. to 150° C.) for 0.5 minutes to 10 minutes (preferably in a range of 1 minute to 5 minutes) from the viewpoint of more excellent reaction efficiency.

The conditions for the light irradiation treatment is not particularly limited, and an ultraviolet irradiation method of generating and applying ultraviolet rays for photocuring is preferable. Ultraviolet lamps used for such method include a metal halide lamp, a high-pressure mercury lamp, a low-pressure mercury lamp, a pulsed xenon lamp, a xenon/mercury mixed lamp, a low-pressure germicidal lamp, and an electrodeless lamp. Among these ultraviolet lamps, a metal halide lamp or a high-pressure mercury lamp is preferable.

In addition, the irradiation conditions vary depending on the conditions of each lamp, but the irradiation exposure quantity may be typically in a range of 20 to 10000 mJ/cm$^2$ and preferably in a range of 100 to 3000 mJ/cm$^2$.

Moreover, the heat treatment or light irradiation may be performed in stages. Further, from the viewpoint of controlling the temperature, the temperature of a roll that comes into contact with the film may be controlled.

Hereinafter, preferred embodiments (1 and 2) of a composition for forming a hard coat layer used to form a hard coat layer will be described below.

[Composition (1) for Forming Hard Coat Layer]

In the present invention, a hard coat layer can be formed on the conductive layer by applying, drying, and curing a compound having an unsaturated double bond, a polymerization initiator, if necessary, light-transmitting particles, a fluorine-containing compound, or a silicone-based compound, or a composition containing a solvent directly or through another layer.

Hereinafter, each component included in the composition (1) for forming a hard coat layer will be described.

(Compound Having Unsaturated Double Bond)

The composition for forming a hard coat layer may contain a compound having an unsaturated double bond. The compound having an unsaturated double bond may function as a binder and it is preferable that the compound is a polyfunctional monomer having two or more polymerizable unsaturated groups. The polyfunctional monomer having two or more polymerizable unsaturated groups may function as a curing agent and is capable of improving the strength of a coated film and abrasion resistance. The number of polymerizable unsaturated groups is more preferably three or more. These monomers can be used in combination of a monofunctional or difunctional monomer with a tri- or higher functional monomer.

Examples of the compound having an unsaturated double bond include compounds having a polymerizable functional group such as a (meth)acryloyl group, a vinyl group, a styryl group, or an allyl group. Among these, a (meth)acryloyl group and C(O)OCH=CH$_2$ are preferable. It is particularly preferable that a compound containing three or more (meth)acryloyl groups in a molecule, described below, is used. In addition, the term "(meth)acryloyl group" indicates an acryloyl group or a methacryloyl group. Similarly, the term "(meth)acrylic acid" described below indicates acrylic acid or methacrylic acid and the term "(meth)acrylate" indicates acrylate or methacrylate.

Specific examples of the compound having a polymerizable unsaturated bond include (meth)acrylic acid diesters of alkylene glycol, (meth)acrylic acid diesters of polyoxyalkylene glycol, (meth)acrylic acid diesters of polyhydric alcohol, (meth)acrylic acid diesters of an ethylene oxide adduct or a propylene oxide adduct, epoxy (meth)acrylates, urethane (meth)acrylates, and polyester (meth)acrylates.

Among these, esters of polyhydric alcohol and (meth)acrylic acid are preferable. Examples thereof include 1,4-butanediol di(meth)acrylate, 1,6-hexanediol di(meth)acrylate, neopentyl glycol (meth)acrylate, ethylene glycol di(meth)acrylate, triethylene glycol di(meth)acrylate, pentaerythritol tetra(meth)acrylate, pentaerythritol tri(meth)acrylate, trimethylol propane tri(meth)acrylate, EO-modified trimethylol propane tri(meth)acrylate, PO-modified trimethylol propane tri(meth)acrylate, EO-modified phosphoric acid tri(meth)acrylate, trimethylolethane tri(meth)acrylate, ditrimethylolpropane tetra(meth)acrylate, dipentaerythritol tetra(meth)acrylate, dipentaerythritol penta(meth)acrylate, dipentaerythritol hexa(meth)acrylate, 1,2,3-cyclohexane tetramethacrylate, polyurethane polyacrylate, polyester polyacrylate, and caprolactone-modified tris(acryloxyethyl)isocyanurate.

Polyfunctional acrylate-based compounds having a (meth)acryloyl group are commercially available and examples thereof include NK ESTER A-TMMT (manufactured by Shin-Nakamura Chemical Co., Ltd.) and KAYARAD DPHA (manufactured by Nippon Kayaku Co., Ltd.). Polyfunctional monomers are described in paragraphs [0114] to [0122] of JP2009-98658A and the same applies to the present invention.

From the viewpoints of adhesiveness to the conductive layer, low curling, and fixing properties of fluorine-containing compounds or silicone-based compounds described below, it is preferable that the compound having an unsaturated double bond is a compound having a hydrogen-bonding substituent. The hydrogen-bonding substituent indicates a substituent obtained by covalently bonding an atom having high electronegativity such as nitrogen, oxygen, sulfur, or halogen to a hydrogen bond, and specific examples thereof include OH—, SH—, NH—, CHO—, and CHN—. Among these, urethane (meth)acrylates or (meth)acrylates having a hydroxyl group are preferable. Further, commercially available polyfunctional acrylate having a (meth)acryloyl group can be used and examples thereof include NK OLIGO U4HA, NK ESTER A-TMM-3 (both manufactured by Shin-Nakamura Chemical Co., Ltd.), and KAYARAD PET-30 (manufactured by Nippon Kayaku Co., Ltd.).

From the viewpoint of imparting a sufficient degree of polymerization to provide hardness, the content of the compound having an unsaturated double bond in the composition for forming a hard coat layer is preferably 50% by mass or greater, more preferably in a range of 60% to 99% by mass, still more preferably in a range of 70% to 99% by mass, and particularly preferably in a range of 80% to 99% by mass with respect to the total solid content obtained by removing inorganic components from the composition for forming a hard coat layer.

It is preferable that a compound having cyclic aliphatic hydrocarbon and an unsaturated double bond in a molecule is used for the composition for forming a hard coat layer. When such a compound is used, low moisture permeability can be provided for a hard coat layer. In order to improve hard coat properties, it is more preferable to use a compound having two or more cyclic aliphatic hydrocarbons and unsaturated double bonds in a molecule.

In a case where the composition for forming a hard coat layer contains a compound having cyclic aliphatic hydrocarbon and an unsaturated double bond in a molecule, the content of the compound, having cyclic aliphatic hydrocarbon and an unsaturated double bond in a molecule, in a compound having an unsaturated double bond in the composition for forming a hard coat layer is preferably in a range of 1% to 90% by mass, more preferably in a range of 2% to 80% by mass, and still more preferably in a range of 5% to 70% by mass.

In a case where the composition for forming a hard coat layer contains a compound having cyclic aliphatic hydrocarbon and an unsaturated double bond in a molecule, it is preferable that the composition further contains penta- or higher functional (meth)acrylate.

In a case where the composition for forming a hard coat layer contains penta- or higher functional (meth)acrylate, the content of the penta- or higher functional (meth)acrylate in the compound having an unsaturated double bond in the composition for forming a hard coat layer is preferably in a range of 1% to 70% by mass, more preferably in a range of 2% to 60% by mass, and particularly preferably in a range of 5% to 50% by mass.

(Light-Transmitting Particles)

When a hard coat layer contains light-transmitting particles, it is possible to provide an uneven shape or inside haze for the surface of the hard coat layer.

Examples of light-transmitting particles which can be used for the hard coat layer include polymethyl methacrylate particles (refractive index of 1.49), crosslinked poly(acryl-styrene) copolymer particles (refractive index of 1.54), melamine resin particles (refractive index of 1.57), polycarbonate particles (refractive index of 1.57), polystyrene particles (refractive index of 1.60), crosslinked polystyrene particle (refractive index of 1.61), polyvinyl chloride particles (refractive index of 1.60), benzoguanamine-melamine formaldehyde particles (refractive index of 1.68), silica particles (refractive index of 1.46), alumina particles (refractive index of 1.63), zirconia particles, titanium particles, and particles having hallows or pores.

Among these, crosslinked ((meth)acrylate) particles, crosslinked poly(acryl-styrene) particles are preferably used, and the unevenness, surface haze, inside haze, and total haze suitable for the hard coat layer can be achieved by adjusting the refractive index of a binder in accordance with the refractive index of respective light-transmitting particles selected from these particles. The refractive index of the binder (light-transmitting resin) is preferably in a range of 1.45 to 1.70 and more preferably in a range of 1.48 to 1.65.

Further, a difference in refractive index between the light-transmitting particles and the binder in the hard coat layer ("refractive index of light-transmitting particles"–"refractive index of hard coat layer from which light-transmitting particles are removed") is, as an absolute value, preferably less than 0.05, more preferably in a range of 0.001 to 0.030, and still more preferably in a range of 0.001 to 0.020. It is preferable that the difference in refractive index between the light-transmitting particles and the binder in the hard coat layer is set to be less than 0.05 because the refracting angle of light due to light-transmitting particles becomes small, scattered light does not spread to have a wide angle, and a deterioration action does not exist.

In order to obtain the above-described difference in refractive index between the particles and the binder, the refractive index of the light-transmitting particles or the refractive index of the binder may be adjusted.

According to a preferred first embodiment, it is preferable to use a combination of light-transmitting particles formed of a binder (the refractive index after curing is in a range of 1.50 to 1.53) having a tri- or higher functional (meth)acrylate monomer as a main component and a crosslinked poly(meth)acrylate-styrene copolymer having 50% to 100% by mass of acryl. The difference in refractive index between the light-transmitting particles and the binder is easily set to be less than 0.05 by adjusting the compositional ratio of an acryl component having a low refractive index and a styrene component having a high refractive index. The mass ratio between the acrylic component and the styrene component is preferably in a range of 50:50 to 100:0, more preferably in a range of 60:40 to 100:0, and most preferably in a range of 65:35 to 90:10. The refractive index of light-transmitting particles formed of a crosslinked poly(meth)acrylate-styrene copolymer is preferably in a range of 1.49 to 1.55, more preferably in a range of 1.50 to 1.54, and most preferably in a range of 1.51 to 1.53.

According to a preferred second embodiment, the refractive index of a binder formed of monomers and inorganic fine particles is adjusted and the difference in refractive index between the binder and light-transmitting particles of the related art is adjusted by combining inorganic fine particles having an average particle size of 1 to 100 nm with a binder having a tri- or higher functional (meth)acrylate monomer as a main component. Examples of inorganic particles include an oxide of at least one metal selected from silicon, zirconium, titanium, aluminum, indium, zinc, tin, and antimony and specific examples thereof include $SiO_2$, $ZrO_2$, $TiO_2$, $Al_2O_3$, $In_2O_3$, $ZnO$, $SnO_2$, $Sb_2O_3$, and ITO. Among these, $SiO_2$, $ZrO_2$, or $Al_2O_3$ is preferable. These inorganic particles can be mixed in a range of 1% to 90% by mass and preferably in a range of 5% to 65% by mass with respect to the total amount of monomers.

Here, the refractive index of the hard coat layer from which light-transmitting particles are removed can be quantitatively evaluated by directly measuring the value using an Abbe refractometer or measuring the spectral reflection spectrum or spectral ellipsometry. The refractive index of the light-transmitting particles is obtained by dispersing the equivalent amount of light-transmitting particles in a solvent whose refractive index is changed by changing the mixing ratio of two kinds of solvents having different refractive index to measure the turbidity and measuring the refractive index of the solvent at the time when the turbidity becomes minimum using a Abbe refractometer.

The average particle diameter of light-transmitting particles is preferably in a range of 1.0 to 12 μm, more preferably in a range of 3.0 to 12 μm, and still more preferably in a range of 4.0 to 10.0 µm, and most preferably in a range of 4.5 to 8 µm. When the difference in refractive index and the grain size are set to be in the above-described range, the scattering angle distribution of light does not spread to a wide angle and blurred characters and contrast deterioration of a display are unlikely to occur. From the viewpoints that the film thickness of a layer to be added does not need to be increased and a problem of curling or an increase in cost is unlikely to occur, the average particle diameter thereof is preferably 12 µm or less. It is preferable that the average particle diameter thereof is in the above-described range from the viewpoints that the coating amount at the time of application is suppressed, the coated surface is rapidly dried, and planar defects such as uneven drying are unlikely to be generated.

Any measurement method can be used as a method of measuring the average particle diameter of light-transmitting particles as long as the method is for measuring the average particle diameter of particles, but, preferably, the average particle diameter thereof can be obtained by observing particles using a transmission electron microscope (magnification of 500000 to 2000000 times), observing 100 particles, and calculating the average value.

The shape of the light-transmitting particles is not particularly limited, but light-transmitting particles having different shapes such as deformed particles (for example, non-spherical particles) may be used in combination in place of spherical particles. Particularly when the short axis of non-spherical particles is aligned to the normal direction of the hard coat layer, particles having small particle diameters compared to the spherical particles can be used.

It is preferable light-transmitting particles are blended into the hard coat layer such that the content thereof is in a range of 0.1% to 40% by mass with respect to the total solid content of the hard coat layer. The content thereof is more preferably in a range of 1% to 30% by mass and still more preferably in a range of 1% to 20% by mass. When the blending ratio of light-transmitting particles is set to be in the above-described range, the inside haze can be controlled to be in the preferable range.

Moreover, the amount of light-transmitting particles to be applied is preferably in a range of 10 to 2500 mg/m$^2$, more preferably in a range of 30 to 2000 mg/m$^2$, and still more preferably in a range of 100 to 1500 mg/m$^2$.

Examples of the method of producing light-transmitting particles include a suspension polymerization method, an emulsion polymerization method, a soap-free emulsion polymerization method, a dispersion polymerization method, and a seed polymerization method, and light-transmitting particles may be produced any of these methods. These production methods can be referred to methods described in, for example, "Experimental Method of Polymer Synthesis" (co-edited by Takayuki Otsu and Kinoshita Masayoshi, published by KAGAKUDOJIN), p. 130, 146, and 147; "Synthetic Polymer" Vol. 1, p. 246 to 290; "Synthetic Polymer" Vol. 3, p. 1 to 108; JP2543503B; JP3508304B; JP2746275B; JP3521560B; JP3580320B; JP1998-1561A (JP-H10-1561A), JP1995-2908A (JP-H07-2908A), JP1993-297506A (JP-H05-297506A), and JP2002-145919A.

From the viewpoints of controlling the haze value and diffusibility and evenness of the coated surface state, monodisperse particles are preferable as the particle size distribution of light-transmitting particles. A CV value representing uniformity of particle diameters is preferably 15% or less, more preferably 13% or less, and still more preferably 10% or less. Further, in a case where a particle having a particle diameter larger than the average particle diameter by 20% or greater is defined as a coarse particle, the percentage of the coarse particles is preferably 1% or less, more preferably 0.1% or less, and still more preferably 0.01% or less. Particles having such particle size distribution are obtained by classification as useful means after preparation or a synthetic reaction. When the number of times of classifications is increased and the degree thereof is made to be high, particles having desired distribution can be obtained.

It is preferable that an air classification method, a centrifugal classification method, a filtration classification method, or an electrostatic classification method is used for the above-described classification.

(Photopolymerization Initiator)

It is preferable that the composition for forming a hard coat layer contains a photopolymerization initiator.

From the viewpoints that the amount of a photopolymerization initiator is sufficiently large enough for polymerizing a polymerizable compound contained in the composition for forming a hard coat layer and the amount thereof is set to be sufficiently low such that the start point is not extremely increased, the content of the photopolymerization initiator in the composition for forming a hard coat layer is preferably in a range of 0.5% to 8% by mass and more preferably in a range of 1% to 5% by mass with respect to the total solid content in the composition for forming a hard coat layer.

(Ultraviolet Absorbing Agent)

The conductive film is used for a member or the like of a display device provided with a touch panel. From the viewpoint of preventing deterioration of liquid crystals or the like, ultraviolet absorbing properties can be provided for the conductive film by allowing the hard coat layer to contain an ultraviolet absorbing agent within the range that does not inhibit UV (ultraviolet rays) curing.

(Solvent)

The composition for forming a hard coat layer may contain a solvent. As the solvent, various solvents can be used in consideration of solubility of a monomer, dispersibility of light-transmitting particles, and drying properties during application. Examples of organic solvents include dibutyl ether, dimethoxy ethane, diethoxy ethane, propylene oxide, 1,4-dioxane, 1,3-dioxolane, 1,3,5-trioxane, tetrahydrofuran, anisole, phenetole, dimethyl carbonate, methyl ethyl carbonate, diethyl carbonate, acetone, methyl ethyl ketone (MEK), diethyl ketone, dipropyl ketone, diisobutyl ketone, cyclopentanone, cyclohexanone, methyl cyclohexanone, ethyl formate, propyl formate, pentyl formate, methyl acetate, ethyl acetate, propyl acetate, methyl propionate, ethyl propionate, γ-butyrolactone, methyl 2-methoxy acetate, methyl 2-ethoxy acetate, ethyl 2-ethoxy acetate, ethyl 2-ethoxy propionate, 2-methoxy ethanol, 2-propoxy ethanol, 2-buthoxy ethanol, 1,2-diacetoxy acetone, acetyl acetone, diacetone alcohol, methyl acetoacetate, ethyl acetoacetate, methyl alcohol, ethyl alcohol, isopropyl alcohol, n-butyl alcohol, cyclohexyl alcohol, isobutyl acetate, methyl isobutyl ketone (MIBK), 2-octanone, 2-pentanone, 2-hexanone, ethylene glycol ethyl ether, ethylene glycol isopropyl ether, ethylene glycol butyl ether, propylene glycol methyl ether, ethyl carbitol, butyl carbitol, hexane, heptane, octane, cyclohexane, methyl cyclohexane, ethyl cyclohexane, benzene, toluene, and xylene, and organic solvents can be used alone or in combination of two or more kinds thereof.

A solvent is used such that the concentration of the solid content in the composition for forming a hard coat layer is set to be preferably in a range of 20% to 80% by mass, more preferably in a range of 30% to 75% by mass, and still more preferably in a range of 40% to 70% by mass.

[Composition (2) for Forming Hard Coat Layer]

Next, a composition for forming an (antistatic) hard coat layer used for an antistatic antireflection film will be described.

Hereinafter, various components contained in the composition (2) for forming a hard coat layer will be described in detail.

(Compound Having Quaternary Ammonium Base)

The composition for forming a hard coat layer contains a compound having a quaternary ammonium base.

As the compound having a quaternary ammonium base, both of a low molecular type compound and a high molecular type compound can be used, but a high molecular type cationic compound is more preferably used from the viewpoint that the high molecular type cationic compound does not have a variation in antistatic properties due to bleed out.

The high molecular type cationic compound having a quaternary ammonium base can be selected from known compounds for use, but a quaternary ammonium base-containing polymer is preferable and a polymer having at least one structural unit represented by any of the following Formulae (I) to (III) is preferable, from the viewpoint of excellent ion conductivity.

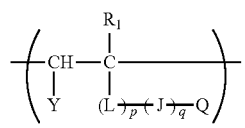

Formula (I)

In Formula (I), $R_1$ represents a hydrogen atom, an alkyl group, a halogen atom, or $CH_2COO^-M^+$. Y represents a hydrogen atom or COO-M+. M+ represents a proton or a cation. L represents —CONH—, —COO—, —CO—, or —O—. J represents an alkylene group, an arylene group, or a group formed by combining these. Q represents a group selected from the following group A.

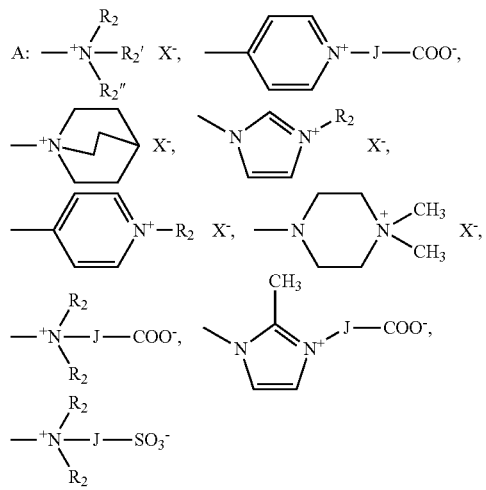

In the formulae, $R_2$, $R_2'$, and $R_2''$ each independently represent an alkyl group. J represents an alkylene group, an arylene group, or a group formed by combining these. X⁻ represents an anion. p and q each independently represent 0 or 1.

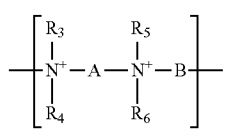

Formula (II)

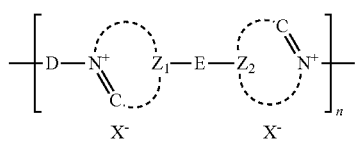

Formula (III)

In Formula (II), $R_3$, $R_4$, $R_5$, and $R_6$ each independently represent an alkyl group. Further, $R_3$ and $R_4$, and $R_5$ and $R_6$ may be bonded to each other to respectively form a nitrogen-containing heterocycle.

A and B in Formula (II) and D in Formula (III) each independently represent an alkylene group, an arylene group, an alkenylene group, an arylene-alkylene group, —$R_7COR_8$—, —$R_9COOR_{10}OCOR_{11}$—, —$R_{12}OCR_{13}COOR_{14}$—, —$R_{15}$—$(OR_{16})$m-, $R_{17}CONHR_{18}NHCOR_{19}$—, —$R_{20}OCONHR_{21}NHCOR_{22}$—, or —$R_{23}NHCONHR_{24}NHCONHR_{25}$—.

E in Formula (III) represents a single bond, an alkylene group, an arylene group, an alkenylene group, an arylene-alkylene group, —$R_7COR_8$—, —$R_9COOR_{10}OCOR_{11}$—, —$R_{12}OCR_{13}COOR_{14}$—, —$R_{15}$—$(OR_{16})$m-, $R_{17}CONHR_{18}NHCOR_{19}$—, —$R_{20}OCONHR_{21}NHCOR_{22}$—, —$R_{23}NHCONHR_{24}NHCONHR_{25}$—, or —$NHCOR_{26}CONH$—. $R_7$, $R_8$, $R_9$, $R_{11}$, $R_{12}$, $R_{14}$, $R_{15}$, $R_{16}$, $R_{17}$, $R_{19}$, $R_{20}$, $R_{22}$, $R_{23}$, $R_{25}$, and $R_{26}$ represent an alkylene group. $R_{10}$, $R_{13}$, $R_{18}$, $R_{21}$, and $R_{24}$ each independently represent a linking group selected from an alkylene group, an alkenylene group, an arylene group, an arylene-alkylene group, and an alkylene-arylene group. m represents a positive integer of 1 to 4.

X- represents an anion.

$Z_1$ and $Z_2$ represent a nonmetallic atomic group required for forming a 5- or 6-membered ring together with a —N=C— group and may be linked to E in the form of a quaternary salt which becomes ≡N⁺[X⁻]—.

n represents an integer of 5 to 300.

Groups of Formulae (I) to (III) will be described.

Examples of a halogen atom include a chlorine atom and a bromine atom. Among these, a chlorine atom is preferable.

As an alkyl group, a branched or linear alkyl group having 1 to 4 carbon atoms is preferable and a methyl group, an ethyl group, or a propyl group is more preferable.

As an alkylene group, an alkylene group having 1 to 12 carbon atoms is preferable and a methylene group, an ethylene group, or a propylene group is more preferable, and an ethylene group is particularly preferable.

As an arylene group, an arylene group having 6 to 15 carbon atoms is preferable, a phenylene group, a diphenylene group, a phenyl dimethylene group, or a naphthylene group is more preferable and a phenyl methylene group is particularly preferable. These groups may include a substituent.

As an alkenylene group, an alkenylene group having 2 to 10 carbon atoms is preferable. As arylene-alkylene group, an arylene-alkylene group having 6 to 12 carbon atoms is preferable. These groups may include a substituent.

Examples of the substituent which may be substituted with each group include a methyl group, an ethyl group, and a propyl group.

In Formula (I), it is preferable that R1 represents a hydrogen atom or a methyl group.

It is preferable that Y represents a hydrogen atom.

It is preferable that L represents —COO—.

It is preferable that J represents a phenylmethylene group, a methylene group, an ethylene group, or a propylene group.

Q represents a group represented by the following Formula (VI) and $R_2$, $R_2'$, and $R_2''$ each represent a methyl group.

X— represents a halogen ion, a sulfonate anion, or a carboxylate anion. Among these, a halogen ion is preferable and a chlorine ion is more preferable.

It is preferable that p and q represent 0 or 1 and more preferable that p and q represent 1.

Formula (VI)

$$\begin{array}{c} R_2 \\ | \\ -\!\!\!-\!\!\!N^+\!\!-\!\!R_2' \quad X^- \\ | \\ R_2'' \end{array}$$

In Formula (II), $R_3$, $R_4$, $R_5$, and $R_6$ represent preferably a substituted or unsubstituted alkyl group having 1 to 4 carbon atoms, more preferably a methyl group or an ethyl group, and particularly preferably a methyl group.

A and B in Formula (II) and D in Formula (III) each independently represent preferably a substituted or unsubstituted alkylene group having 2 to 10 carbon atoms, an arylene group, an alkenylene group, or an arylene-alkylene group and more preferably a phenyldimethylene group.

X— represents a halogen ion, a sulfonate anion, or a carboxylate anion. Among these, a halogen ion is preferable and a chlorine ion is more preferable.

It is preferable that E represents a single bond, an alkylene group, an arylene group, an alkenylene group, or an arylene-alkylene group.

As the 5- or 6-membered ring formed by $Z_1$ and $Z_2$ together with a —N=C— group, a diazoniabicyclooctane ring or the like may be exemplified.

Hereinafter, specific examples of the compound having a structural unit represented by any of Formulae (I) to (III) will be described, but the present invention is not limited thereto. In the subscripts (m, x, y, r, and actual numerical values) of the following specific examples, m represents the number of repeating units of each unit and x, y, and r represent the molar ratio of each unit.

IP-1 m≈50

IP-2 m≈35

IP-3 m≈50

IP-4 m≈50

IP-5 m≈50

IP-6 m≈50

IP-7 x:y = 60:40
m≈80

IP-8 x:y = 70:30
m≈80

-continued

IP-9

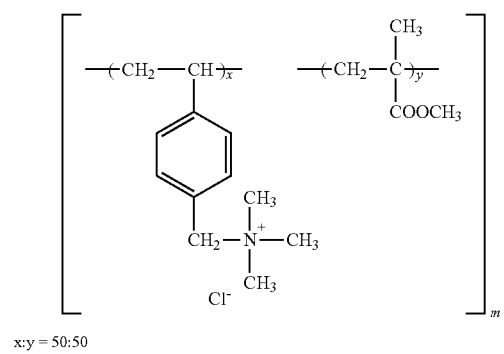

x:y = 50:50
m≈80

IP-10

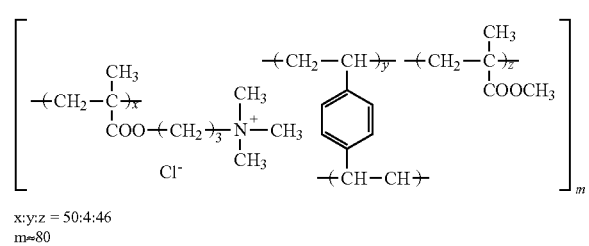

x:y:z = 50:4:46
m≈80

IP-11

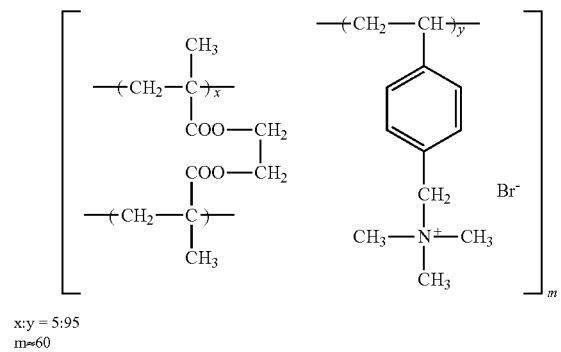

x:y = 5:95
m≈60

IP-12

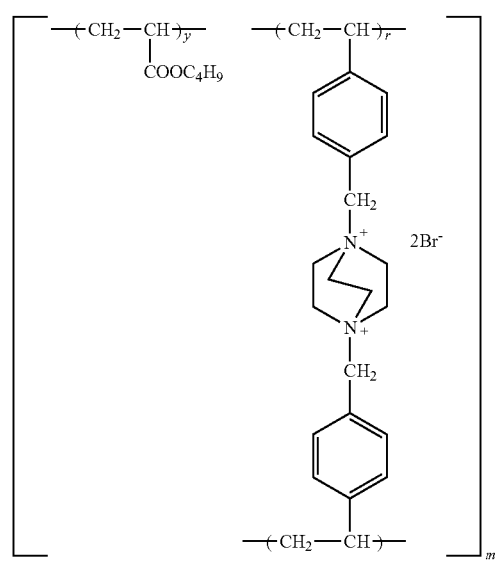

y:r = 7:93
m≈30

-continued

IP-13

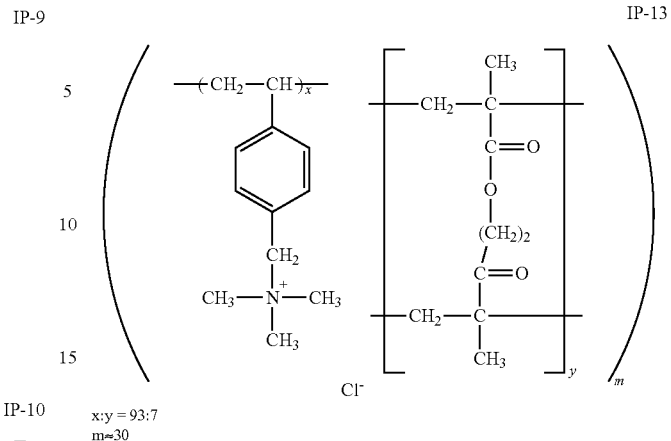

x:y = 93:7
m≈30

The conductive compounds exemplified in the above may be used alone or in combination of two or more compounds. Further, an antistatic compound having a polymerizable group in a molecule of an antistatic agent is more preferable because scratch resistance (film hardness) of an antistatic layer can be also improved.

As the compound having a quaternary ammonium base, commercially available products can be used. Examples thereof include "LIGHT ESTER DQ-100" (trade name, manufactured by KYOEISHA CHEMICAL Co., Ltd.), "LIODURAS LAS-1211" (trade name, manufactured by TOYO INK CO., LTD.), "SHIKOU UV-AS-102" (trade name, manufactured by Nippon Synthetic Chemical Industry Co., Ltd.), and "NK OLIGO U-601 and 201" (manufactured by Shin-Nakamura Chemical Co., Ltd.).

A quaternary ammonium base-containing polymer may include a structural unit (repeating unit) other than the structural units (ionic structural units) represented by the above-described Formulae (I) to (III). When a compound having a quaternary ammonium base includes a structural unit other than ionic structural units, solubility in a solvent during preparation of a composition and compatibility with a compound having an unsaturated double bond or a photopolymerization initiator can be improved.

The polymerizable compound used to introduce a structural unit other than structural units represented by the above-described Formulae (I) to (III) is not particularly limited, and examples thereof include polymerizable compounds selected from a compound having an alkylene oxide chain such as polyethylene glycol mono(meth)acrylate, polypropylene glycol mono(meth)acrylate, polybutylene glycol mono(meth)acrylate, poly(ethylene glycol-propylene glycol) mono(meth)acrylate, poly(ethylene glycol-tetramethylene glycol) mono(meth)acrylate, poly(propylene glycol-tetramethylene glycol) mono(meth)acrylate, polyethylene glycol mono(meth)acrylate monomethyl ether, polyethylene glycol mono(meth)acrylate monobutyl ether, polyethylene glycol mono(meth)acrylate monooctyl ether, polyethylene glycol mono(meth)acrylate monobenzyl ether, polyethylene glycol mono(meth)acrylate monophenyl ether, polyethylene glycol mono(meth)acrylate monodecyl ether, polyethylene glycol mono(meth)acrylate monododecyl ether, polyethylene glycol mono(meth)acrylate monotetradecyl ether, polyethylene glycol mono(meth)acrylate monohexadecyl ether, polyethylene glycol mono(meth)acrylate monooctadecyl ether, poly(ethylene glycol-propylene glycol) mono(meth)acrylate octyl ether, poly(ethylene glycol-propylene glycol) mono(meth)acrylate octadecyl ether, or poly(ethylene glycol-propylene glycol) mono(meth)acrylate nonyl phenyl ether; alkyl (meth)acrylate such as methyl (meth)acrylate, ethyl (meth)acrylate, propyl (meth)acrylate, butyl (meth)acrylate, 2-ethylhexyl (meth)acrylate, dodecyl (meth)acrylate, or octadecyl (meth)acrylate; hydroxyalkyl (meth)acrylate such as hydroxyethyl (meth)acrylate, hydroxypropyl (meth)acrylate, or hydroxybutyl (meth)acrylate; various (meth)acrylates such as benzyl (meth)acrylate, cyclohexyl (meth)acrylate, isobornyl (meth)acrylate, dicyclopentenyl (meth)acrylate, dicyclopentenyloxyethyl (meth)acrylate, ethoxyethyl (meth)acrylate, ethylcarbitol (meth)acrylate, butoxyethyl (meth)acrylate, cyanoethyl (meth)acrylate, and glycidyl (meth)acrylate; styrene; and methylstyrene; and combinations of these.

From the viewpoints that the amount of the compound having a quaternary ammonium base in the composition for forming a hard coat layer is sufficient enough to provide antistatic properties and the film hardness is unlikely to be impaired, the content thereof is preferably in a range of 1% to 30% by mass, more preferably in a range of 3% to 20% by mass, and still more preferably in a range of 5% to 15% by mass with respect to the total solid content in the composition for forming a hard coat layer.

(Compound Having Unsaturated Double Bond)

The composition for forming a hard coat layer may contain a compound having an unsaturated double bond. The compound having an unsaturated double bond has the same definition as the compound described in the above-described section of "Composition (1) for forming hard coat layer".

From the viewpoint of imparting a polymerization rate sufficiently to provide the hardness or the like, the content of the compound having an unsaturated double bond in the composition for forming a hard coat layer is preferably in a range of 40% to 98% by mass and more preferably in a range of 60% to 95% by mass with respect to the total solid content in the composition for forming a hard coat layer.

(Photopolymerization Initiator)

The composition for forming a hard coat layer may contain a photopolymerization initiator.

Examples of the photopolymerization initiator include acetophenones, benzoins, benzophenones, phosphine oxides, ketals, anthraquinones, thioxanthones, azo compounds, peroxides, 2,3-dialkyldione compounds, disulfide compounds, fluoroamine compounds, aromatic sulfoniums, lophine dimers, onium salts, borate salts, active esters, active halogens, inorganic complexes, and coumarins. The specific examples, preferred embodiments, and commercially available products of the photopolymerization initiator are the same as those described in paragraphs [0133] to [0151] of JP2009-098658A, and those can be also suitably used in the present invention.

Various examples thereof are also described in "Latest UV Curing Technology" {Technical Information institute Co., Ltd.} (1991), p. 159 and "UV Curing System" written by Kiyoshi Kato (1989, published by Sogo Gijutsu Center Co., Ltd.), p. 65 to 148 and the examples can be used in the present invention.

From the viewpoints that the amount of a photopolymerization initiator is sufficiently large enough to polymerize a polymerizable compound contained in the composition for forming a hard coat layer and the amount thereof is set to be sufficiently low such that the start point is not extremely increased, the content of the photopolymerization initiator in the composition for forming a hard coat layer is preferably in a range of 0.5% to 8% by mass and more preferably in a range of 1% to 5% by mass with respect to the total solid content in the composition for forming a hard coat layer.

(Solvent)

The composition for forming a hard coat layer may contain various organic solvents.

From the viewpoint of obtaining compatibility with an ion-conductive compound, it is preferable that the composition of the present invention contains a hydrophilic solvent. Examples of the hydrophilic solvent include alcohol-based solvents, carbonate-based solvents, and ester-based solvents. Specific examples thereof include methanol, ethanol, isopropanol, n-butyl alcohol, cyclohexyl alcohol, 2-ethyl-1-hexanol, 2-methyl-1-hexanol, 2-methoxyethanol, 2-propoxyethanol, 2-butoxyethanol, diacetone alcohol, dimethyl carbonate, diethyl carbonate, diisopropyl carbonate, methyl ethyl carbonate, methyl n-propyl carbonate, ethyl formate, propyl formate, pentyl formate, methyl acetate, ethyl acetate, propyl acetate, methyl propionate, ethyl propionate, ethyl 2-ethoxy propionate, methyl acetoacetate, ethyl acetoacetate, methyl 2-methoxy acetate, methyl 2-ethoxy acetate, ethyl 2-ethoxy acetate, acetone, 1,2-diacetoxy acetone, and acetyl acetone, and these solvents can be used alone or in combination of two or more kinds thereof.

Further, solvents other than the above-described solvents may be used. Examples thereof include ether-based solvents, ketone-based solvents, aliphatic hydrocarbon-based solvents, and aromatic hydrocarbon-based solvents. Specific examples thereof include dibutyl ether, dimethoxy ethane, diethoxy ethane, propylene oxide, 1,4-dioxane, 1,3-dioxolane, 1,3,5-trioxane, tetrahydrofuran, anisole, phenetole, methyl ethyl ketone (MEK), diethyl ketone, dipropyl ketone, diisobutyl ketone, cyclopentanone, cyclohexanone, methyl cyclohexanone, methyl isobutyl ketone, 2-octane, 2-pentanone, 2-hexanone, ethylene glycol ethyl ether, ethylene glycol isopropyl ether, ethylene glycol butyl ether, propylene glycol methyl ether, ethyl carbitol, butyl carbitol, hexane, heptane, octane, cyclohexane, methyl cyclohexane, ethyl cyclohexane, benzene, toluene, and xylene, and these solvents can be used alone or in combination of two or more kinds thereof.

A solvent is used such that the concentration of the solid content in the composition for forming a hard coat layer is preferably in a range of 20% to 80% by mass, more preferably in a range of 30% to 75% by mass, and most preferably in a range of 40% to 70% by mass.

(Surfactant)

Various surfactants may be suitably used for the composition for forming a hard coat layer. Typically, a surfactant suppresses film thickness irregularity caused by uneven drying due to local distribution of dry air and improves surface unevenness of an antistatic layer or cissing a coated product. In addition, preferably, excellent conductivity can be more stably expressed in some cases by improving the dispersibility of an antistatic compound.

As a surfactant, specifically, a fluorine-based surfactant or a silicone-based surfactant is preferable. Further, it is preferable that a surfactant is an oligomer or a polymer rather than a low-molecular weight compound.

When a surfactant is added, since the surfactant is rapidly moved to the surface of a coated liquid film and unevenly distributed and the surfactant is unevenly distributed on the surface as it is after the film is dried, the surface energy of the hard coat layer to which the surfactant is added is decreased due to the surfactant. From the viewpoint of preventing film thickness irregularity, cissing, and unevenness of the hard coat layer, it is preferable that the surface energy of the film is low.

Particularly from the viewpoint of preventing point defects caused by cissing and unevenness, a fluoroaliphatic group-containing copolymer including a repeating unit derived from a monomer containing a fluoroaliphatic group represented by the following Formula (F1) and a repeating unit derived from a monomer which does not contain a fluoroaliphatic group represented by the following Formula (F2) is preferable as the fluorine-based surfactant.

Formula (F1)

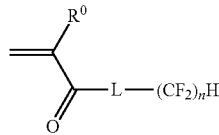

(In the formula, $R^0$ represents a hydrogen atom, a halogen atom, or a methyl group. L represents a divalent linking group. n represents an integer of 1 to 18.)

Formula (F2)

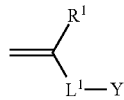

(In the formula, $R^1$ represents a hydrogen atom, a halogen atom, or a methyl group. $L^1$ represents a divalent linking group. Y represents a linear, branched, or cyclic alkyl group which may have a substituent and has 1 to 20 carbon atoms or an aromatic group which may have a substituent.)

It is preferable that a monomer containing a fluoroaliphatic group represented by Formula (F1) is a monomer containing a fluoroaliphatic group represented by the following Formula (F1-1).

Formula (F1-1)

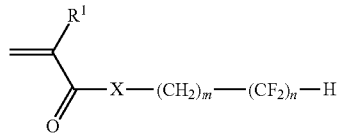

(In the formula, $R^1$ represents a hydrogen atom, a halogen atom, or a methyl group. X represents an oxygen atom, a sulfur atom, or —N($R^2$)—. m represents an integer of 1 to 6. n represents an integer of 1 to 18. $R^2$ represents a hydrogen atom or an alkyl group which may have a substituent and has 1 to 8 carbon atoms.)

Preferred embodiments and specific examples of the fluoroaliphatic group-containing copolymer are described in paragraphs [0023] to [0080] of JP2007-102206A and the same applies to the present invention.

Preferred examples of the silicone-based surfactant include surfactants which include plural dimethylsilyloxy units as repeating units and have substituents at the terminal and/or side chain of the compound chain. The compound chain having dimethylsilyloxy as a repeating unit may include a structural unit other than dimethylsilyloxy. The substituents may be the same or different from each other and it is preferable that a plurality of substituents are present. Preferred examples of the substituents include groups having a polyether group, an alkyl group, an aryl group, an aryloxy group, a cinnamoyl group, an oxetanyl group, a fluoroalkyl group, or a polyoxyalkylene group.

The molecular weight is not particularly limited, but is preferably 100000 or less and more preferably 50000 or less, particularly preferably in a range of 1000 to 30000, and most preferably in a range of 1000 to 20000.

Preferred examples of the silicone-based compound include "X-22-174DX", "X-22-2426", "X22-164C", "X-22-176D" (all trade names, manufactured by Shin-Etsu Chemical Co., Ltd.); "FM-7725", "FM-5521", "FM-6621", (all trade names, manufactured by CHISSO CORPORATION); "DMS-U22", "RMS-033" (all trade names, manufactured by Gelest, Inc.); "SH200", "DC11PA", "ST80PA, "L7604", "FZ-2105", "L-7604", "Y-7006", "SS-2801" (all trade names, manufactured by Dow Corning Toray Co., Ltd.); and "TSF400" (trade name, manufactured by Momentive Performance Materials Inc.), but the examples are not limited to these.

The content of the surfactant is preferably in a range of 0.01% to 0.5% by mass and more preferably in a range of 0.01% to 0.3% by mass with respect to the total solid content of the composition for forming a hard coat layer.

Moreover, a photosensitive composition described in JP2012-78528A may be used as the composition for forming a hard coat layer in place of the composition (1) for forming a hard coat layer and the composition (2) for forming a hard coat layer described above.

<Protective Film (Polarizer Protective Film)>

A protective film is arbitrarily disposed on the surface of the polarizer on the opposite side to the conductive layer side and has a function of protecting the polarizer.

As the protective film, a known transparent support can be used. Examples of the material that forms a transparent support include a cellulose acylate resin represented by triacetyl cellulose, a cycloolefine resin (ZEONEX and ZEONOR manufactured by ZEON CORPORATION or ARTON manufactured by JSR Corporation), a (meth) acrylic resin, and a polyester resin.

The thickness of the protective film is not particularly limited, but is preferably 40 μm or less and more preferably 25 μm or less from the viewpoint that the thickness can be reduced.

<λ/4 Plate>

A λ/4 plate is an optional layer disposed between the polarizer and the conductive film. When the λ/4 plate is disposed, a circularly polarizing plate can be formed with the polarizer and the λ/4 plate. The circularly polarizing plate can be used for preventing reflection of external light.

The λ/4 plate (plate having the λ/4 function) is a plate having a function of converting linearly polarized light having a specific wavelength into circularly polarized light (alternatively, circularly polarized light into linearly polarized light). More specifically, the λ/4 plate is a plate in which the in-plane retardation value at a predetermined wavelength of λ nm is λ/4 (or odd times this value).

An in-plane retardation value (Re (550)) at a wavelength of 550 nm in the λ/4 plate may have an error of approximately 25 nm, is preferably in a range of 110 to 160 nm, more preferably in a range of 120 to 150 nm, and still more preferably in a range of 130 to 145 nm based on the ideal value (137.5 nm).

In a case where the polarizer and the λ/4 plate function as a circularly polarized light plate, the angle θ formed by an absorption axis of the polarizer and the in-plane slow axis of the λ/4 plate is preferably in a range of 45±100 when a λ/4 plate having a single-layer structure is used. In other words, the angle θ is preferably in a range of 35° to 55°.

Moreover, the angle indicates an angle formed by the absorption axis of the polarizer and the in-plane slow axis of the λ/4 plate when seen from the normal direction of the surface of the polarizer.

The λ/4 plate may have a multilayer structure. As an example of the multilayer structure, a broadband λ/4 plate formed by laminating a λ/2 plate and a λ/4 plate on each other may be exemplified. For example, in a case where a polarizer and a broadband λ/4 plate (including a λ/2 plate and a λ/4 plate from the polarizer side) are laminated on each other, the angle formed by a transmission axis of the polarizer and an in-plane slow axis of the λ/2 plate is preferably in a range of 15±10° and the angle formed by the transmission axis of the polarizer and an in-plane slow axis of the λ/4 plate is preferably in a range of 75±10°.

A material constituting the λ/4 plate is not particularly limited as long as the material shows the above-described characteristics, and examples thereof include a material containing a liquid crystal compound (for example, a homogeneously aligned optically anisotropic layer including a liquid crystal compound) and a polymer film. Among these, a material containing a liquid crystal compound is preferable from the viewpoint that the above-described characteristic are easily controlled. More specifically, it is preferable that the λ/4 plate is a layer formed by fixing a liquid crystal compound (a rod-like liquid crystal compound or a discotic liquid crystal compound) including a polymerizable group through polymerization or the like. In this case, the λ/4 plate does not need to exhibit liquid crystallinity after becoming a layer.

<Conductive Film and Applications Thereof>

The conductive film of the present invention includes at least the polarizer and the conductive layer which is disposed on the polarizer and contains fullerene functionalized carbon nanotubes.

The sheet resistance value of the conductive film is not particularly limited, but is preferably in a range of 10 to 150Ω/□ and more preferably in a range of 10 to 100Ω/□, from the viewpoint of more excellent conductivity.

The sheet resistance value is a value measured using Loresta-GP (MCP-T600) (Mitsubishi Chemical Holdings Corporation) in conformity with JIS K 7194 according to a four probe method.

The above-described conductive film can be used for various applications and, for example, may be used for a touch panel or the like.

Hereinafter, a preferred embodiment of a case where the conductive film is applied to a touch panel will be described in detail.

<Touch Panel and Display Device Provided with a Touch Panel>

The above-described conductive film can be suitably used for a touch panel (preferably, a capacitance touch panel). More specifically, the conductive film can be used as a member constituting a touch panel and a conductive layer can be suitably used for a detection electrode (sensor electrode) for sensing a change in capacitance or a lead-out wiring (peripheral wiring) used for applying a voltage to a detection electrode.

First Embodiment

Hereinafter, a first embodiment of a display device provided with a touch panel to which the conductive film of the present invention is applied will be described with reference to FIG. 1. FIG. 1 is a sectional view schematically illustrating an example of a liquid crystal display device provided with a touch panel of the present invention. Further, FIG. 1 is a view schematically illustrated for ease of understanding of a layer structure of the liquid crystal display device provided with a touch panel and does not precisely illustrates the disposition of each layer.

As illustrated in FIG. 1, a liquid crystal display device 10 provided with a touch panel includes a touch panel 16 configured of a polarizer 12 and a first conductive layer 14A for a touch panel; a liquid crystal cell 22 which includes a pair of bases 18A and 18B for a liquid crystal cell and a liquid crystal layer 20 formed between the pair of bases 18A and 18B for a liquid crystal cell; and a polarizer 24 of the liquid crystal cell 22 on the opposite side to the touch panel 16 side. The liquid crystal display device 10 provided with a touch panel illustrated in FIG. 1 has an on-cell structure in which a first conductive layer 14A for a touch panel is disposed between the polarizer 12 and the base 18B for a liquid crystal cell. Moreover, in the liquid crystal display device 10 provided with a touch panel, a backlight (not illustrated) may be disposed on the polarizer 24 on the opposite side to the liquid crystal cell 22 side. Moreover, pressure sensitive adhesive layers (not illustrated) may be disposed between each member. Further, if necessary, the above-described protective film (for example, a resin substrate or a glass substrate) may be disposed on the surface of the polarizer 12 on the viewing side (the surface on the opposite side to the first conductive layer 14A provided with a touch panel).

Moreover, when a finger approaches and touches the surface (touch surface) of the polarizer 12 in the liquid crystal display device 10 provided with a touch panel, the capacitance between the finger and the detection electrode in the touch panel 16 is changed. Here, when a change in capacitance of a predetermined value or greater is detected, a position detection driver (not illustrated) detects the position at which the change in capacitance is detected as an input position. In this manner, the touch panel 16 is capable of detecting an input position.

Figure 2:
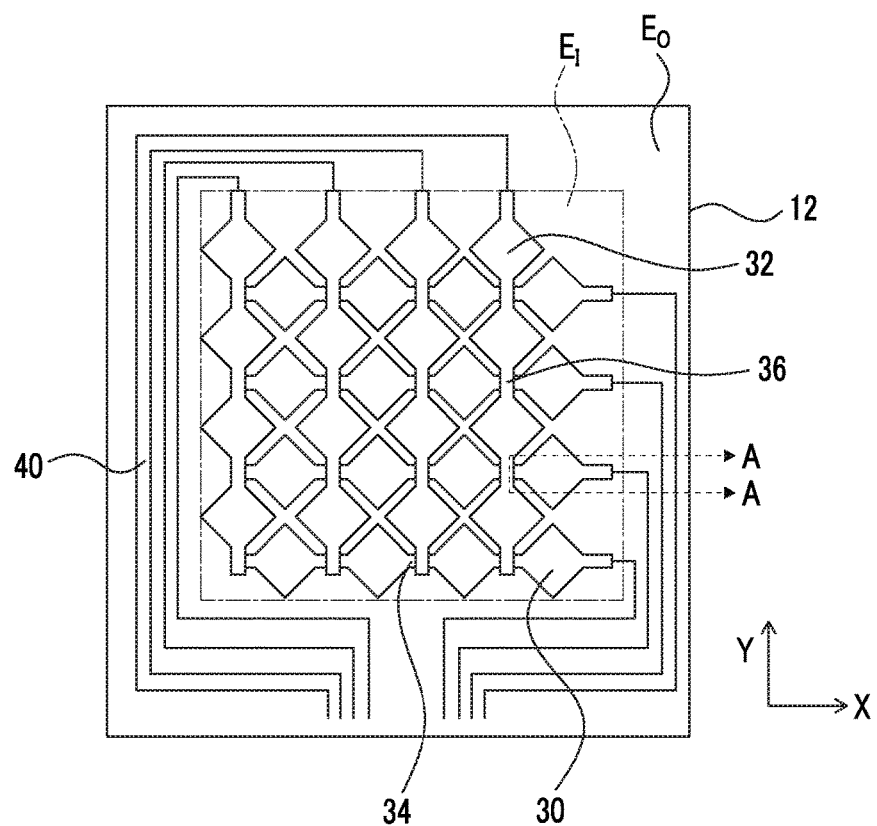
FIG. 2 is a plan view schematically illustrating a touch panel.
Figure 3:
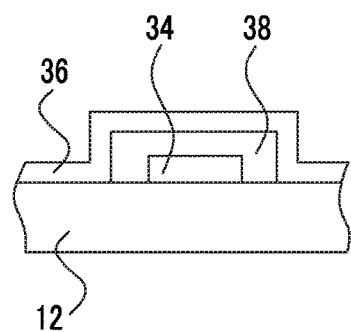
FIG. 3 is an enlarged sectional view taken along the cutting line A-A of FIG. 2.

FIG. 2 is a plan view schematically illustrating an example of the touch panel 16 used for the liquid crystal display device 10 provided with a touch panel illustrated in FIG. 1. FIG. 3 is an enlarged sectional view taken along the line A-A of FIG. 2 and is a view illustrating a portion of a first electrode array and a second electrode array intersecting with each other.

The touch panel 16 includes is provided with the first conductive layer 14A for a touch panel which is disposed on the polarizer 12, and the first conductive layer 14A for a touch panel includes a first electrode 30, a second electrode 32, a first connecting portion 34, a second connecting portion 36, an insulating layer 38, and a lead-out wring 40.

The first electrode 30, the second electrode 32, and the lead-out wiring 40 contain fullerene functionalized carbon nanotubes. That is, the first electrode 30, the second electrode 32, and the lead-out wiring 40 correspond to the above-described conductive layer. Further, the present invention is not limited to this embodiment, and the conductive layer 14 for a touch panel may have the above-described conductive layer containing fullerene functionalized carbon nanotubes and the first connecting portion 34 and the second connecting portion 36 other than the first electrode 30, the second electrode 32, and the lead-out wiring 40 may contain fullerene functionalized carbon nanotubes.

Hereinafter, each member included in the conductive layer 14 for a touch panel will be described in detail.

More specifically, a plurality (four in FIG. 2) of first electrodes 30 are linearly arranged in an x direction (horizontal direction in FIG. 2) and each of the electrodes is connected to the first connecting portion 34 to form a first electrode array. In addition, a plurality (four arrays in FIG. 2) of the first electrode arrays are arranged in parallel with each other on the polarizer 12. The first electrode arrays correspond to so-called detection electrodes.

Further, a plurality (four in FIG. 2) of second electrodes 32 are linearly arranged in a y direction (machine direction in FIG. 2) perpendicular to the x direction and each of the electrodes is connected to the second connecting portion 36 to form a second electrode array. In addition, a plurality (four arrays in FIG. 2) of the second electrode arrays are arranged in parallel with each other on the polarizer 12. The second electrode arrays correspond to so-called detection electrodes.

In addition, since the first electrode array and the second electrode array are arranged by intersecting with each other such that the first connecting portion 34 and the second connecting portion 36 overlap each other, the first electrodes 30 and the second electrodes 32 are arranged in a lattice shape on the polarizer 12.

Moreover, since the first connecting portion 34 and the second connecting portion 36 overlap each other, an insulating layer 38 is interposed between the first connecting portion 34 and the second connecting portion 36 in order to prevent conduction of the second connecting portion 36 perpendicular to the first connecting portion 34 for insulation.

Moreover, since the lead-out wiring 40 connected to each of the first electrode array and the second electrode array is disposed on the polarizer 12 so that the first electrode 30, the second electrode 32, and a control circuit (not illustrated) are connected to each other through the lead-out wiring 40.

In addition, a region in which the first electrode 30 and the second electrode 32 are present constitute an input region $E_1$ (input region (sensing unit) capable of sensing contact of an object) which is capable of performing an input operation by an operator, and the lead-out wiring 40 and a flexible printed wiring board (not illustrated) are disposed on an outer region $E_0$ positioned outside of the input region $E_1$.

The liquid crystal cell 22 includes at least the pair of bases 18A and 18B for a liquid crystal cell and the liquid crystal layer 20 and may include other members (for example, a color filter, a TFT Backplane, and the like).

Further, the liquid crystal display device 10 provided with a touch panel may further include a light source.

Second Embodiment

Hereinafter, a second embodiment of a liquid crystal display device provided with a touch panel to which the conductive film of the present invention is applied will be described with reference to FIG. 4.

Figure 4:
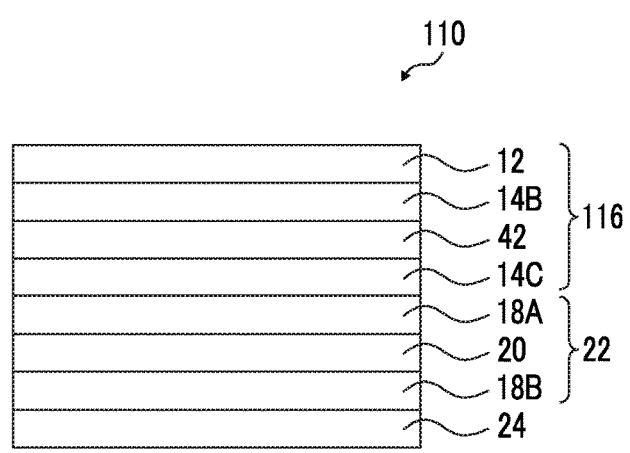
FIG. 4 is a sectional view schematically illustrating a liquid crystal display device provided with a touch panel according to a second embodiment of the present invention.

As illustrated in FIG. 4, a liquid crystal display device 110 provided with a touch panel of the present invention includes a polarizer 12, a second conductive layer 14B for a touch panel, a pressure sensitive adhesive layer 42, a third conductive layer 14C for a touch panel, a liquid crystal cell 22 which includes a pair of bases 18A and 18B for a liquid crystal cell and a liquid crystal layer 20 formed between the pair of bases 18A and 18B for a liquid crystal cell, and a polarizer 24. The polarizer 12, the second conductive layer 14B for a touch panel, the pressure sensitive adhesive layer 42, and the third conductive layer 14C for a touch panel constitute a touch panel 116. As described below, the second conductive layer 14B for a touch panel, the above-described conductive layer containing fullerene functionalized carbon nanotubes may be exemplified. That is, the conductive film including the polarizer 12 and the second conductive layer 14B for a touch panel corresponds to the conductive film of the present invention.

The liquid crystal display device 110 provided with a touch panel illustrated in FIG. 4 has the same configurations as those of the liquid crystal display device 10 provided with a touch panel illustrated in FIG. 1 except for the touch panel 116. Therefore, the same constituent elements are denoted by the same reference numerals and the description thereof will not be repeated. Hereinafter, the touch panel 116 will be mainly described in detail.

Figure 5:
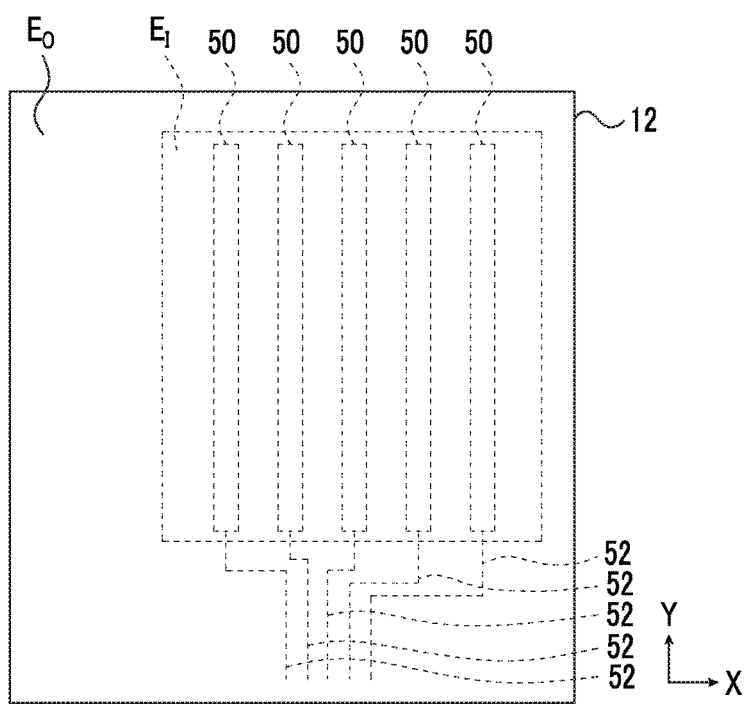
FIG. 5 is a plan view schematically illustrating a laminate X.
Figure 6:
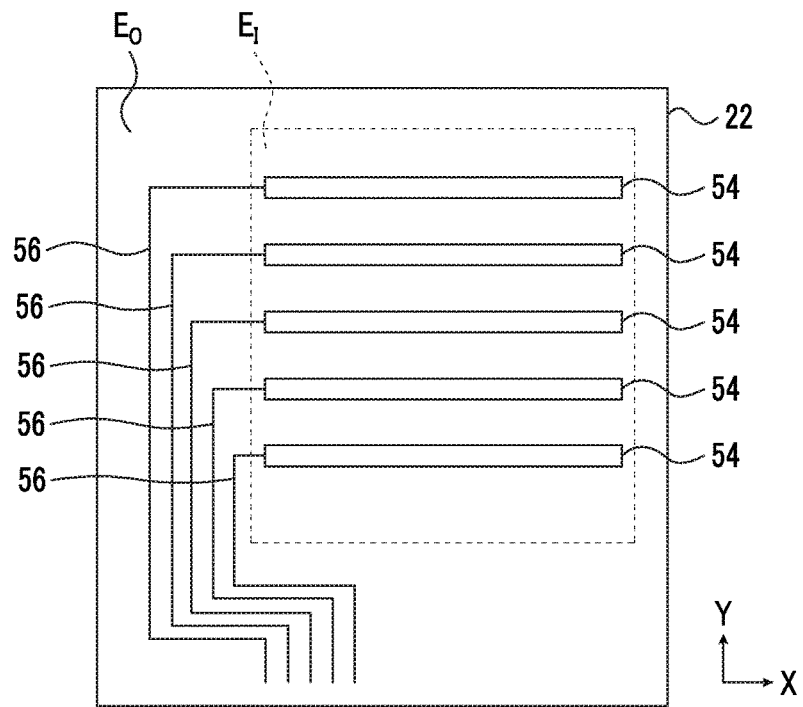
FIG. 6 is a plan view schematically illustrating a laminate Y.

FIG. 5 is a plan view illustrating a laminate X including the polarizer 12 and the second conductive layer 14B for a touch panel observed from the viewing side (polarizer 12 side). FIG. 6 is a plan view illustrating a laminate Y including the third conductive layer 14C for a touch panel and the liquid crystal cell 22 observed from the viewing side.

As illustrated in FIG. 5, the laminate X includes the polarizer 12 and the second conductive layer 14B for a touch panel which is disposed on the back surface side of the polarizer 12, and the second conductive layer 14B for a touch panel includes a first detection electrode 50 and a first lead-out wiring 52.

The first detection electrode 50 and the first lead-out wiring 52 include fullerene functionalized carbon nanotubes. That is, the first detection electrode 50 and the first lead-out wiring 52 correspond to the above-described conductive layer. Further, the present invention is not limited to this embodiment, and only the first detection electrode 50 may be the above-described conductive layer containing fullerene functionalized carbon nanotubes.

Further, the first detection electrode 50 plays a role of detecting an input position in a Y direction of a finger of an operator having approached the input region EI and has a function of generating capacitance between the finger and the detection electrode. The first detection electrode 50 is an electrode which extends in the Y direction and is aligned in an X direction perpendicular to the Y direction at a predetermined interval.

In addition, the first lead-out wiring 52 is disposed on the polarizer 12 in the outer region $E_0$. One end thereof is electrically connected to the corresponding first detection electrode 50 and the other end is electrically connected to a flexible printed wiring board (not illustrated).

As illustrated in FIG. 6, the laminate Y includes the liquid crystal cell 22 and the third conductive layer 14C for a touch panel which is disposed on the back surface side of the liquid crystal cell 22, and the third conductive layer 14C for a touch panel includes a second detection electrode 54 and a second lead-out wiring 56.

The second detection electrode 54 and the second lead-out wiring 56 include fullerene functionalized carbon nanotubes.

Further, the second detection electrode 54 plays a role of detecting an input position in the X direction of a finger of an operator having approached the input region EI and has a function of generating capacitance between the finger and the detection electrode. The second detection electrode 54 is an electrode which extends in the X direction and is aligned in the Y direction at a predetermined interval.

In addition, the second lead-out wiring 56 is disposed on the polarizer 22 in the outer region $E_0$. One end thereof is electrically connected to the corresponding second detection electrode 54 and the other end is electrically connected to a flexible printed wiring board (not illustrated).

As illustrated in FIGS. 5 and 6, the first detection electrode 50 and the second detection electrode 54 are disposed so as to be orthogonal to each other when the liquid crystal display device 110 provided with a touch panel is observed from the viewing side.

A region in which the first electrode 50 and the second electrode 54 are present constitute an input region EI (input region (sensing unit) capable of sensing contact of an object) which is capable of performing an input operation by an operator, and the first lead-out wiring 52 and the second lead-out wiring 56 are disposed on an outer region $E_O$ positioned outside of the input region EI.

Further, the pressure sensitive adhesive layer 42 is a layer connecting members to each other and a known pressure sensitive adhesive layer can be used.

Third Embodiment

Hereinafter, a third embodiment of a liquid crystal display device provided with a touch panel to which the conductive film of the present invention is applied will be described with reference to FIG. 7.

Figure 7:
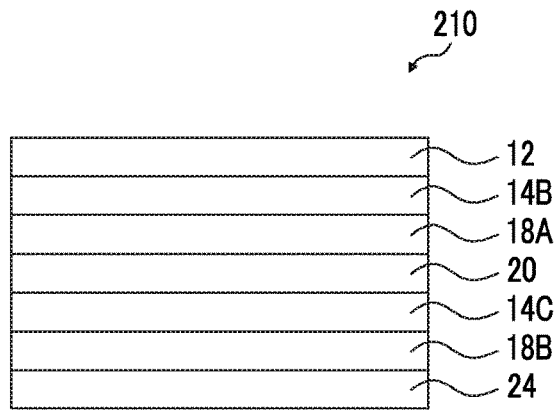
FIG. 7 is a sectional view schematically illustrating a liquid crystal display device provided with a touch panel according to a third embodiment of the present invention.

As illustrated in FIG. 7, a liquid crystal display device 210 provided with a touch panel of the present invention includes a polarizer 12, a second conductive layer 14B for a touch panel, a pair of bases 18A and 18B for a liquid crystal cell, a liquid crystal layer 20 formed between the pair of bases 18A and 18B for a liquid crystal cell, a third conductive layer 14C for a touch panel, and a polarizer 24. The polarizer 12, the second conductive layer 14B for a touch panel, and the third conductive layer 14C for a touch panel constitute a touch panel.

The liquid crystal display device 210 provided with a touch panel illustrated in FIG. 7 has the same configurations as those of the liquid crystal display device 110 provided with a touch panel illustrated in FIG. 4 except that disposition of each layer varies. Therefore, the same constituent elements are denoted by the same reference numerals and the description thereof will not be repeated.

In the liquid crystal display device 210 provided with a touch panel, the first detection electrode 50 in the second conductive layer 14B for a touch panel and the second detection electrode 54 in the third conductive layer 14C for a touch panel are disposed so as to be orthogonal to each other similar to the liquid crystal display device 110 provided with a touch panel illustrated in FIG. 4.

(Use for Other Applications)

As described above, the conductive film of the present invention may include a λ/4 plate. In this case, the obtained conductive film functions as a so-called circularly polarized light plate, becomes a constituent element of a touch panel when disposed on an organic EL display device, and functions as a circularly polarized light plate that prevents reflection of external light.

Figure 8:
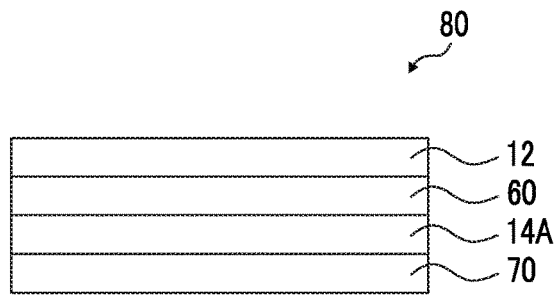
FIG. 8 is a sectional view schematically illustrating an organic electroluminescence (EL) display device provided with a touch panel according to one embodiment.

As a specific embodiment, an organic EL display device 80 provided with a touch panel including a polarizer 12, a λ/4 plate 60, a first conductive layer 14A for a touch panel, and an organic EL display device 70 as illustrated in FIG. 8 may be exemplified. The polarizer 12, the λ/4 plate 60, and the first conductive layer 14A for a touch panel constitute the conductive film of the present invention and an angle formed by a transmission axis of the polarizer 12 and an in-plane slow axis of the λ/4 plate 60 is 45°.

Figure 9:
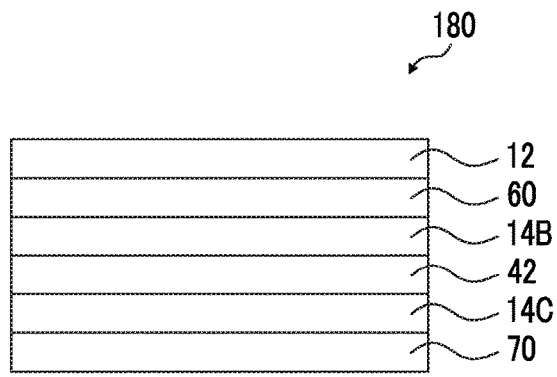
FIG. 9 is a sectional view schematically illustrating an organic EL display device provided with a touch panel according to another embodiment.

In addition, as another specific embodiment, an organic EL display device 180 provided with a touch panel including a polarizer 12, a λ/4 plate 60, a second conductive layer 14B for a touch panel, a pressure sensitive adhesive layer 42, a third conductive layer 14C for a touch panel, and an organic EL display device 70 as illustrated in FIG. 9 may be exemplified. An angle formed by a transmission axis of the polarizer 12 and an in-plane slow axis of the λ/4 plate 60 is 45°.

EXAMPLES

Hereinafter, the present invention will be described in more detail with reference to examples, but the present invention is not limited thereto.

Example 1

(Preparation of Polarizer Provided with Protective Film)

A commercially available cellulose acylate film (FUJITAC TJ25UL, manufactured by Fujifilm Corporation) was immersed in 1.5 mol/L of a NaOH aqueous solution (saponification solution) at 55° C. for 2 minutes and the film was washed with water. Thereafter, the film was immersed in 0.05 mol/L of a sulfuric acid aqueous solution at 25° C. for 30 seconds and then exposed to flowing water for 30 seconds so that the state of the film was set to be neutral. Further, draining was carried out three times using an air knife, the film was allowed to stay for 15 seconds in a drying zone at 70° C. after water was dropped and then dried, and then a film subjected to a saponification treatment was prepared.

The film subjected to a saponification treatment was bonded to one surface of a polarizer (polyvinyl alcohol-based resin (PVA)-containing polarizer) having a film thickness of 8 μm using a polyvinyl alcohol-based adhesive and dried at 70° C. for 10 minutes, thereby preparing a polarizer provided with a protective film. Here, the film was disposed such that the conveyance direction of the film and the transmission axis of the polarizer were orthogonal to each other.

(Synthesis of Fullerene Functionalized Carbon Nanotubes (CBFFCNT))

CBFFCNT was synthesized from carbon monoxide as a carbon source using perrocene as a catalyst particle source and water vapor and/or carbon dioxide as a reagent (one or plural kinds). Hereinafter, the conditions are described in detail.

Carbon source: CO. Catalyst particle source: ferrocene (partial pressure of vapor in reactor: 0.7 Pa). Use oven temperature: 800° C., 1000° C., and 1150° C. Use flow rate: internal flow (including ferrocene vapor) of CO at 300 ccm and external flow of CO at 100 ccm. Reagent: water vapor (150 and 270 ppm) and/or carbon dioxide (1500 to 12000 ppm).

The synthesis was performed in the manner described in FIG. 3A of JP2009-515804A. In this embodiment, catalyst particles were instantly grown by ferrocene vapor decomposition. The precursor was evaporated by passing CO at room temperature through a cartridge (4) filled with ferrocene powder from a gas cylinder (2) (at a flow rate of 300 ccm). Thereafter, the flow containing ferrocene vapor was introduced to a high-temperature zone of a ceramic tube reactor through a water-cooled probe (5) and then mixed with the additional CO flow (1) at a flow rate of 100 ccm.

Subsequently, an oxidizing etchant (for example, water and/or carbon dioxide) was introduced thereto together with a carbon source. In addition, the partial pressure of ferrocene vapor in the reactor was maintained to 0.7 Pa. Thereafter, the set temperature of the reactor wall was changed from 800° C. to 1150° C.

Aerosol products were recovered at the downstream of the reactor by any of a silver disc filter or a grid of a transmission electron microscope (TEM). It was confirmed that CBFFCNT in which carbon nanotubes and fullerenes were covalently bonded to each other was present in these aerosol products.

A conductive layer containing CBFFCNT was prepared on a filter by filtering the obtained aerosols using a filter of nitrocellulose having a diameter of 2.45 cm. In addition, the temperature of the filter surface at the time of filtration was 45° C.

Next, the conductive layer disposed on the filter was transferred to the surface of the polarizer provided with a protective film and the conductive layer (thickness: 10 μm) was disposed on the polarizer.

Subsequently, a hard coat layer (thickness: 6 μm) was prepared on the obtained conductive layer according to the method described below, thereby obtaining a conductive film.

(Procedures for Preparing Hard Coat Layer)

4 parts by mass of IRGACURE 184 (photopolymerization initiator, manufactured by BASF Japan Ltd.) was added to a mixed solvent of methyl ethyl ketone (MEK) and methyl isobutyl ketone (MIBK) and dissolved therein while the solution was stirred, thereby preparing a solution having 40% by mass of a final solid content. Pentaerythritol triacrylate (PETA), U-4HA (tetrafunctional urethane oligomer, weight-average molecular weight of 600, manufactured by Shin-Nakamura Chemical Co., Ltd.), U-15HA (15 functional urethane oligomer, weight-average molecular weight of 2300, manufactured by Shin-Nakamura Chemical Co., Ltd.), and a polymer (7975-D41, acrylic double bond equivalent of 250, weight-average molecular weight of 15000, manufactured by Hitachi Chemical Co., Ltd.) were added, as resin components, to the solution at a solid content ratio of 25 parts by mass:25 parts by mass:40 parts by mass:10 parts by mass and the solution was stirred. A leveling agent (trade name: MEGAFACE F-477, manufactured by DIC Corporation) was added to the solution at a solid content ratio of 0.2 parts by mass and the solution was stirred, thereby preparing a composition for forming a hard coat layer.

The conductive layer was coated with the composition for forming a hard coat layer according to slit reverse coating to form a coated film. The obtained coated film was dried at 70° C. for 1 minute, irradiated with ultraviolet rays at an ultraviolet irradiation dose of 150 mJ/cm$^2$, and cured, thereby forming a hard coat layer having a thickness of 6 μm.

Examples 2 to 14

Conductive films were obtained in the same manner as in Example 1 except that the type of polarizer provided with a protective film used in Example 1 was changed.

Further, in Examples 2 to 10, the type of protective film and the thickness of polarizer were changed and then conductive films were prepared in the same manner as in Example 1.

Moreover, in Examples 11 and 12, conductive films were prepared in the same manner as in Example 1 except that a laminate Z including an acrylic film and a polarizer (thickness: 5 μm) and a laminate W including an acrylic film and a polarizer (thickness: 3 μm), serving as coating type PVA polarizer-containing laminates described below, were used in place of the polarizer provided with a protective film.

Moreover, in Examples 13 and 14, conductive films were prepared in the same manner as in Example 1 except that a laminate V including a cellulose acylate film and a polarizer (thickness: 5 μm) and a laminate P including a cellulose acylate film and a polarizer (thickness: 3 μm), serving as coating type PVA polarizer-containing laminates described below, were used in place of the polarizer provided with a protective film.

(Preparation of Coating Type PVA Polarizer-Containing Laminate)

A laminate (laminate Z) including an acrylic film and a polarizer (thickness: 5 μm) was prepared in the same manner as in Example 5 (paragraph 0161) of JP4691205B except that an acrylic film (Technolloy S001G, manufactured by Sumitomo Chemical Company Ltd.) was used in place of a triacetyl cellulose (TAC) film. Further, a laminate (laminate W) including an acrylic film and a polarizer (thickness: 3 μm) was prepared in the same manner as in JP4691205B except that the thickness of the polarizer was changed into 3 μm from 5 μm.

Moreover, a laminate (laminate V) including a cellulose acylate film and a polarizer (thickness: 5 μm) was prepared using a cellulose acylate film (TJ25UL, manufactured by Fujifilm Corporation) in place of the acrylic film. Further, a laminate (laminate P) including a cellulose acylate film and a polarizer (thickness: 3 μm) was prepared in the same manner as in JP4691205B except that the thickness of the polarizer was changed into 3 μm from 5 μm.

The following evaluation was performed using conductive films of the examples and the comparative examples obtained in the above-described manner. Further, the obtained results are collectively listed in Table 1.

In regard to Comparative Examples 1 and 2, a moisture heat durability test described below was performed using the above-described laminate Z and laminate W.

<Moisture Heat Durability Test>

Samples having a size of 50 mm×50 mm were cut out from the prepared conductive films, and hard coat layers (polarizers in Comparative Examples 1 and 2) in conductive films were bonded to glass plates using a pressure sensitive adhesive. The prepared samples were treated at −30° C. for 30 minutes, the temperature thereof was increased to 70° C. at a rate of 5° C./minute, and the samples were treated at 70° C. for 30 minutes, and then the temperature thereof was decreased to −30° C. at a rate of −5° C./minute. These series of operations were repeated 200 times. The series of operations were finished and the conductive films were visually observed. A case where cracks were not found in a polarizer was evaluated as "A" and a case where cracks were found in a polarizer was evaluated as "B".

<Measurement of Transmittance and Polarization Degree>

A single transmittance T (%), a parallel transmittance Tp (%), and an orthogonal transmittance Tc (%) of the prepared conductive films were measured using an ultraviolet and visible spectrophotometer (V7100, manufactured by JASCO Corporation). These transmittances T, Tp, and Tc are Y values which were measured by a two-degree field of view (C light source) of JIS Z 8701 and on which visibility correction was performed.

Next, a polarization degree P was acquired according to the following equation using the above-described transmittances.

Polarization degree $P$ (%)=$\{(Tp-Tc)/(Tp+Tc)\}^{1/2} \times 100$

Moreover, the "transmittance (%)" in Table 1 shown below corresponds to the above-described "single transmittance (%)". Further, the above-described parallel transmittance indicates a transmittance of a sample obtained, using two sheets of conductive films, by laminating the two sheets of conductive films on each other such that transmittance axes of polarizers in the conductive films are parallel with each other. Further, the above-described orthogonal transmittance indicates a transmittance of a sample obtained, using two sheets of conductive films, by laminating the two sheets of conductive films on each other such that transmission axes of polarizers in the conductive films are orthogonal to each other.

<Measurement of Sheet Resistance Value>

Samples having a size of 80 mm×50 mm were cut out from the prepared conductive films and the sheet resistance values were measured using Loresta-GP (MCP-T600) (Mitsubishi Chemical Holdings Corporation) in conformity with JIS K 7194 according to a four probe method.

In Table 1, the "PVA" indicates a polyvinyl alcohol-based resin.

In Table 1, the "HC layer" indicates a hard coat layer.

The types of supports represented by symbols in the columns of "protective film" in Table 1 are as follows.

TJ25: cellulose acylate film (FUJITAC TJ25UL, manufactured by Fujifilm Corporation)

Sample A: referred to the description below

TG40: cellulose acylate film (FUJITAC TG40UL, manufactured by Fujifilm Corporation)

ZRD40: cellulose acylate film (FUJITAC ZRD40, manufactured by Fujifilm Corporation)

Cycloolefine: cycloolefine film (ZF14, manufactured by Zeon Corporation)

Acryl: acrylic film (Technolloy S001G, manufactured by Sumitomo Chemical Company Ltd.)

(Preparation of Sample A)

(Preparation of Core Layer Cellulose Acylate Dope)

The following composition was put into a mixing tank and stirred and each component was dissolved therein, and then a cellulose acetate solution was prepared.

| | |
|---|---|
| Cellulose acetate having an acetyl substitution degree of 2.88 | 100 parts by mass |
| Ester oligomer A | 10 parts by mass |
| The following additive B | 4 parts by mass |
| Ultraviolet absorbing agent C | 2 parts by mass |
| Methylene chloride C (first solvent) | 430 parts by mass |
| Methanol (second solvent) | 64 parts by mass |

(Ester Oligomer A)

A copolymer (terminal is formed of an acetyl group) of an aromatic dicarboxylic acid (ratio of adipic acid:phthalic acid is 3:7) and a diol (ethylene glycol). Molecular weight of 1000

(Additive B)

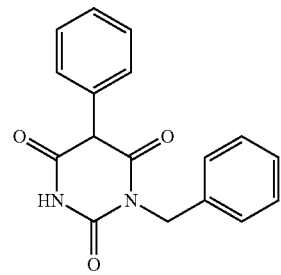 [SMILES: O=C1NC(=O)N(Cc2ccccc2)C(=O)C1c1ccccc1]

(Ultraviolet Absorbing Agent C)

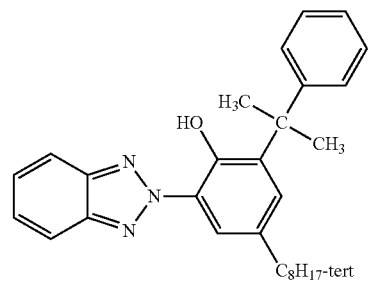

(Preparation of Outer Layer Cellulose Acylate Dope)

An outer layer cellulose acetate solution was prepared by adding 10 parts by mass of the following matting agent solution having the following composition to 90 parts by mass of the above-described core layer cellulose acylate dope.

| | |
|---|---|
| Silica particles having average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope | 1 part by mass |

(Preparation of Cellulose Acylate Film)

The core layer cellulose acylate dope and outer layer cellulose acylate dopes on both side of the core layer cellulose acylate dope, that are, three layers were cast on a drum at 20° C. from a casting port at the same time. The outer layers were peeled off in a state in which the solvent content was 20% by mass, both ends of the film in the width direction were fixed with tenter clips, and the film was dried while being stretched to 1.1 times in the transverse direction in a state in which the residual solvent was in a range of 3% to 15%. Thereafter, the film was further dried by being conveyed between rolls of a heat treatment device, thereby preparing a cellulose acylate film (sample A) having a thickness of 40 μm.

TABLE 1

| | Conductive film | | | | | Evaluation | | | |
|---|---|---|---|---|---|---|---|---|---|
| | | Polarizer | | | | | | Polarization | Sheet resis- |
| | Type of protective film | Type | Thickness (μm) | Conductive layer | HC layer | Moisture heat durability test | Transmittance (%) | degree (%) | tance value (Ω/□) |
| Example 1 | TJ25 | PVA | 8 | Present | Present | A | 43.2 | 99.996 | 80 |
| Example 2 | TJ25 | PVA | 15 | Present | Present | A | 42.9 | 99.997 | 90 |
| Example 3 | Sample A | PVA | 8 | Present | Present | A | 42.7 | 99.996 | 100 |

TABLE 1-continued

| | Conductive film | | | | | Evaluation | | | |
|---|---|---|---|---|---|---|---|---|---|
| | | Polarizer | | | | | | Polarization | Sheet resis- |
| | Type of protective film | Type | Thickness (μm) | Conductive layer | HC layer | Moisture heat durability test | Transmittance (%) | degree (%) | tance value (Ω/□) |
| Example 4 | Sample A | PVA | 15 | Present | Present | A | 42.2 | 99.997 | 110 |
| Example 5 | TG40 | PVA | 8 | Present | Present | A | 42.8 | 99.996 | 95 |
| Example 6 | TG40 | PVA | 15 | Present | Present | A | 42.3 | 99.997 | 100 |
| Example 7 | ZRD40 | PVA | 8 | Present | Present | A | 42.9 | 99.994 | 100 |
| Example 8 | ZRD40 | PVA | 15 | Present | Present | A | 42.3 | 99.992 | 110 |
| Example 9 | Cycloolefine | PVA | 8 | Present | Present | A | 43 | 99.993 | 90 |
| Example 10 | Cycloolefine | PVA | 15 | Present | Present | A | 42.5 | 99.994 | 100 |
| Example 11 | Acryl | Coating type PVA | 5 | Present | Present | A | 43.2 | 99.99 | 80 |
| Example 12 | Acryl | Coating type PVA | 3 | Present | Present | A | 42.9 | 99.992 | 75 |
| Example 13 | TJ25 | Coating type PVA | 5 | Present | Present | A | 43.1 | 99.99 | 85 |
| Example 14 | TJ25 | Coating type PVA | 3 | Present | Present | A | 42.8 | 99.992 | 80 |
| Comparative Example 1 | Acryl | Coating type PVA | 5 | Absent | Absent | B | — | — | — |
| Comparative Example 2 | Acryl | Coating type PVA | 3 | Absent | Absent | B | — | — | — |

As listed in Table 1, in the conductive films of the present invention, cracking in polarizers was suppressed during the moisture heat durability test and thus performance degradation did not occur in the polarizers.

Meanwhile, in Comparative Examples 1 and 2 in which conductive layers were not disposed, occurrence of cracks was found in polarizers during the moisture heat durability test.

In addition, in Examples 1 to 14, various evaluations were performed using conductive films respectively including a hard coat layer, and cracking in polarizers was suppressed during the moisture heat durability test even in a case of conductive films which did not have a hard coat layer and thus performance degradation did not occur in the polarizers.

Example 15: Preparation of Touch Panel

Conductive layers were disposed on a polarizer provided with a protective film according to the procedures of Example 1. Next, by following procedures described below, as illustrated in FIG. 5, conductive layers in other portions were removed through etching by leaving only the conductive layers positioned in portions of the first detection electrodes and the first lead-out wirings. Subsequently, hard coat layers were respectively disposed on patterned conductive layers in the same manner as in Example 1, thereby obtaining a conductive film. Further, the length of the first detection electrode was 170 mm and the number of the first detection electrodes was 32.

Next, a third conductive layer 14C for a touch panel in which a conductive layer including CBFFCNT was present in the positions of the second detection electrode and the second lead-out wiring as illustrated in FIG. 6 was prepared by referring to the procedures of Example 1. The length of the second detection electrode included in the third conductive layer for a touch panel was 300 mm and the number of the second detection electrodes was 56.

Next, various members were bonded to each other using the obtained conductive film and a liquid crystal cell in order of lamination illustrated in FIG. 4, thereby obtaining a display device provided with a touch panel illustrated in FIG. 4.

(Method of Etching Conductive Layer)

A desired pattern was formed on a conductive layer disposed on a polarizer according to a laser etching method (for example, see WO2013/176155A) using a UV laser.

In the description above, the conductive layer was disposed on the polarizer and subjected to an etching treatment, and then a hard coat layer was disposed on the patterned conductive layer. Alternatively, after a conductive layer and a hard coat layer were disposed on a polarizer, a conductive layer with a predetermined pattern was prepared according to the above-described etching method, and then a display device provided with a touch panel was prepared in the above-described manner.

In addition, a display device provided with a touch panel illustrated in FIG. 1 was obtained by disposing a conductive layer on one surface of a polarizer, changing the etching pattern of the conductive layer, changing the pattern shown in the first conductive layer 14A for a touch panel illustrated in FIG. 2, preparing a predetermined conductive layer, and bonding various members to each other in order of lamination illustrated in FIG. 1.

Further, a display device provided with a touch panel illustrated in FIG. 7 was obtained by changing the position of the conductive layer.

Further, the polarizer provided with a protective film used in Example 1 was used in the above, but various display device provided with a touch panel were obtained in the same manner as described above even when the polarizers provided with a protective film used in Examples 2 to 12.

In the preparation of Example 1, a conductive film including a λ/4 plate was prepared by disposing a λ/4 plate between the polarizer and the conductive layer. At this time, the conductive layer was adjusted so as to have a pattern shown in the first conductive layer 14A for a touch panel illustrated in FIG. 2.

The obtained conductive film including a λ/4 plate was disposed on an organic EL display device as illustrated in FIG. 8.

In addition, the method of preparing a λ/4 plate was as follows.

(Alkali Saponification Treatment)

A cellulose acylate film (TG40UL, manufactured by Fujifilm Corporation) was allowed to pass through an induction heating roll at 60° C., the temperature of the film surface was increased to 40° C., the band surface of the film was coated with an alkali solution having the composition described below at a coating amount of 14 ml/m² using a bar coater, and then the film was conveyed for 10 seconds under a steam-type far-infrared heater (manufactured by NORITAKE Co., LTD.) heated to 110° C. Next, the surface thereof was coated with 3 ml/m2 of pure water using a bar coater in the same manner. Subsequently, washing with water using a fountain coater and draining using an air knife were repeatedly performed on the film three times and then the film was conveyed for 10 seconds to a drying zone at 70° C. to be dried, thereby preparing a cellulose acylate film subjected to an alkali saponification treatment.

Composition of Alkali Solution

| | |
|---|---|
| Potassium hydroxide | 4.7 parts by mass |
| Water | 15.8 parts by mass |
| Isopropanol | 63.7 parts by mass |
| Surfactant SF-1: C14H29O (CH2CH2O)20H | 1.0 part by mass |
| Propylene glycol | 14.8 parts by mass |

(Formation of Alignment Layer)

The surface of the cellulose acylate film subjected to the alkali saponification treatment was continuously coated with an alignment film coating solution (A) having the composition described below using a #14 wire bar. The film was dried with warm air at 60° C. for 60 seconds and further dried with warm air at 100° C. for 120 seconds. The saponification degree of modified polyvinyl alcohol used was 96.8%.

Composition of Alignment Film Coating Solution (A)

| | |
|---|---|
| Modified polyvinyl alcohol 1 described below | 10 parts by mass |
| Water | 308 parts by mass |
| Methanol | 70 parts by mass |
| Isopropanol | 29 parts by mass |

| | |
|---|---|
| Photopolymerization initiator (IRGACURE 2959, manufactured by Ciba Specialty Chemical K.K.) | 0.8 parts by mass |

[Modified Polyvinyl Alcohol 1]

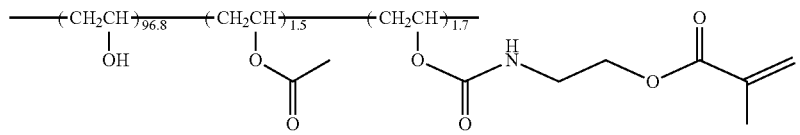

(Formation of First Optical Anisotropic Layer)

The prepared alignment film was continuously subjected to a rubbing treatment. At this time, the longitudinal direction and the conveyance direction of the long film were parallel with each other and the angle formed by the film longitudinal direction and a rotating shaft of a rubbing roller was set to 75° (clockwise) (when the film longitudinal direction was set to 90°, the rotation shaft of the rubbing roller was 15°).

The above-described alignment film was continuously coated with the optically anisotropic layer coating solution (A) including a discotic liquid crystal compound having the composition described below using a #5.0 wire bar and treated under the following conditions, and a retardation plate (F1) having a first optically anisotropic layer (H) was prepared. In addition, the conveyance speed (V) of the film was set to 26 m/min. For the purpose of drying the solvent of the coating solution and alignment aging of the discotic liquid crystal compound, the plate was heated with warm air at 130° C. for 90 seconds, then heated further with warm air at 100° C. for 60 seconds, and irradiated with UV rays at 80° C. to fix the alignment of the liquid crystal compound. The thickness of the first optically anisotropic layer (H) was 2.0 µm. It was confirmed that the average tilt angle of the disk plane of the discotic liquid crystal (DLC) compound with respect to the film surface was 90° and the DLC compound was aligned vertically to the film surface. The slow axis was parallel with the rotating shaft of the rubbing roller and the angle thereof was 15° when the film longitudinal direction was set to 90° (film width direction was set to 0°).

Composition of Optically Anisotropic Layer Coating Solution (A)

| | |
|---|---|
| Discotic liquid crystal 1 | 80 parts by mass |
| Discotic liquid crystal 2 | 20 parts by mass |
| Alignment film interface alignment agent 1 | 0.55 parts by mass |
| Alignment film interface alignment agent 2 | 0.05 parts by mass |
| Fluorine-containing compound (FP-1) | 0.1 parts by mass |
| Modified trimethylol propane triacrylate | 10 parts by mass |
| Photopolymerization initiator (IRGACURE 907, manufactured by Ciba Specialty Chemical K.K.) | 3.0 parts by mass |
| Methyl ethyl ketone | 200 parts by mass |

Discotic Liquid Crystal 1
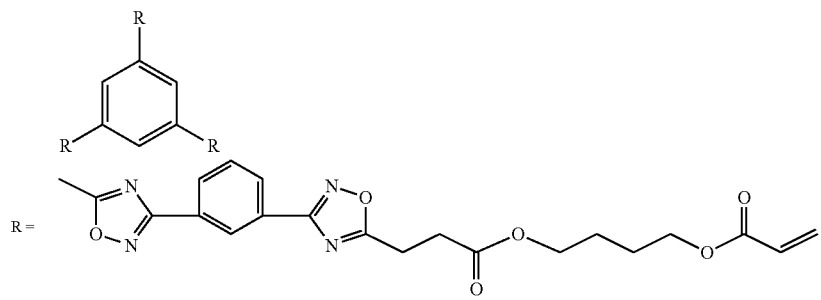
Discotic Liquid Crystal 2
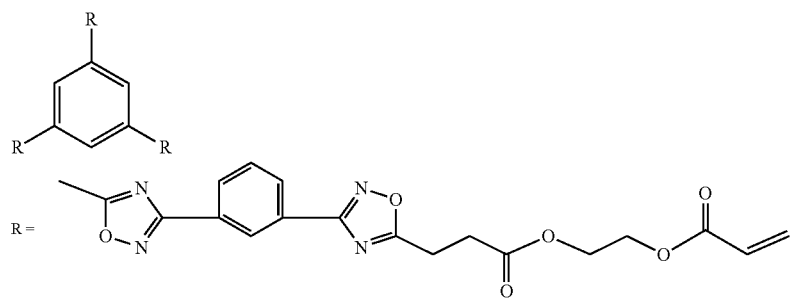
Alignment Film Interface Alignment Agent 1
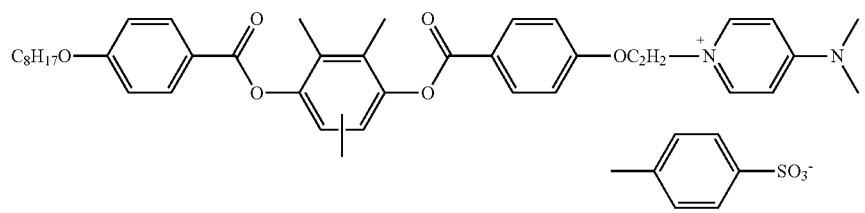
Alignment Film Interface Alignment Agent 2
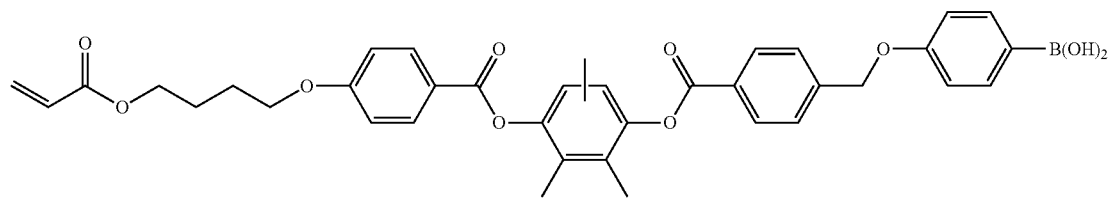
Fluorine-Containing Compound (FP-1)
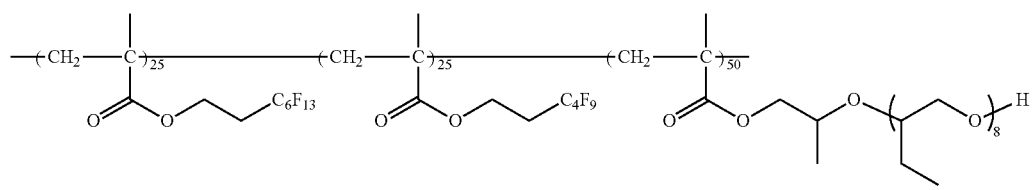

Preparation of Retardation Plate (F2)

(Preparation of Peelable Support)

A peelable support was prepared in the same manner as the production of the alignment film except that the alignment film was prepared as described below without applying an alkali saponification treatment to the above-described cellulose acylate film.

(Formation of Alignment Film)

The cellulose acylate film was continuously coated with an alignment film coating solution (B) having the following composition using a #14 wire bar. The film was dried with warm air at 60° C. for 60 seconds and further dried at 100° C. for 120 seconds.

Composition of Alignment Film Coating Solution (B)

| | |
|---|---|
| Modified polyvinyl alcohol 2 described below | 10 parts by mass |
| Water | 371 parts by mass |
| Methanol | 119 parts by mass |
| Glutaraldehyde (crosslinking agent) | 0.5 parts by mass |
| Citric acid ester (AS3, manufactured by SANKYO CHEMICAL Co., Ltd.) | 0.175 parts by mass |
| Photopolymerization initiator (IRGACURE 2959, manufactured by Ciba Specialty Chemical K.K.) | 2.0 parts by mass |

[Modified Polyvinyl Alcohol 2]

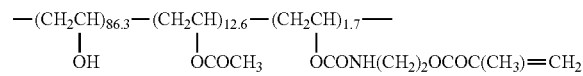

(Formation of Second Optically Anisotropic Layer (Q))

The prepared alignment film was continuously subjected to a rubbing treatment. At this time, the longitudinal direction and the conveyance direction of the long film were parallel with each other and the angle formed by the film longitudinal direction and a rotating shaft of a rubbing roller was set to 75° (clockwise) (when the film longitudinal direction was set to 90°, the rotation shaft of the rubbing roller was 15°).

The above-described alignment film was continuously coated with the optically anisotropic layer coating solution (B) including a rod-like liquid crystal compound having the composition described below using a #2.2 wire bar and treated under the following conditions, and a retardation plate (F2) having a second optically anisotropic layer (Q) was prepared. In addition, the conveyance speed (V) of the film was set to 26 m/min. For the purpose of drying the solvent of the coating solution and alignment aging of the rod-like liquid crystal compound, the plate was heated with warm air at 60° C. for 60 seconds and irradiated with UV rays at 60° C. to fix the alignment of the liquid crystal compound. The thickness of the second optically anisotropic layer (Q) was 0.8 μm. It was confirmed that the average tilt angle of the long axis of the rod-like liquid crystal compound with respect to the film surface was 0° and the liquid crystal compound was aligned horizontally to the film surface. The slow axis was orthogonal to the rotating shaft of the rubbing roller and the angle thereof was 105° when the film longitudinal direction was set to 90° (film width direction was set to 0°).

Composition of Optically Anisotropic Layer Coating Solution (B)

| | |
|---|---|
| Rod-like liquid crystal compound 1 | 80 parts by mass |
| Rod-like liquid crystal compound 2 | 2.0 parts by mass |
| Photopolymerization initiator (IRGACURE 907, manufactured by Ciba Specialty Chemical K.K.) | 3 parts by mass |
| Sensitizer (KAYACURE DETX, manufactured by Nippon Kayaku Co., Ltd.) | 1 part by mass |
| Fluorine-containing compound (FP-2) | 0.3 parts by mass |
| Methyl ethyl ketone | 193 parts by mass |

[Rod-Like Liquid Crystal Compound 1]

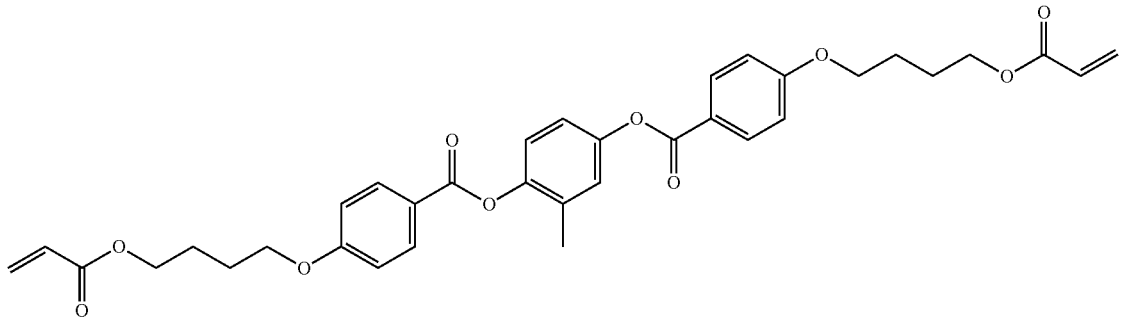 [SMILES: C=CC(=O)OCCCCOc1ccc(C(=O)Oc2ccc(OC(=O)c3ccc(OCCCCOC(=O)C=C)cc3)c(C)c2)cc1]

[Rod-Like Liquid Crystal Compound 2]

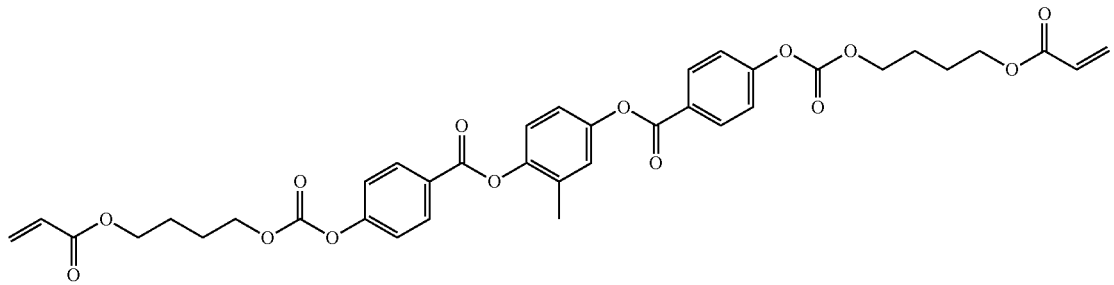 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

[Fluorine-Containing Compound (FP-2)]

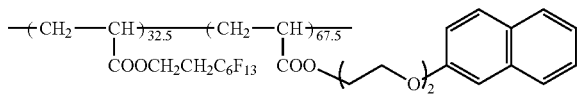

(Preparation of λ/4 Plate)

The surface of the above-described retardation plate (F1) coated with the first optically anisotropic layer (H) and the surface of the above-described retardation plate (F2) coated with the second optically anisotropic layer (Q) were continuously bonded to each other using a pressure sensitive adhesive layer, and the above-described peelable support was peeled off between the cellulose acylate film (T1) and the alignment film. In this manner, a long circularly polarizing plate (P2) was prepared. In addition, an absorption axis of the polarizer in the conductive film coincides with the longitudinal direction of the polarizer and the angle formed by the absorption axis of the polarizer and the slow axis of the second optically anisotropic layer (Q) was 15°.

Moreover, the in-plane retardation of the first optically anisotropic layer (H) at a wavelength of 550 nm was 275 nm and the in-plane retardation of the second optically anisotropic layer (Q) at a wavelength of 550 nm was 137.5 nm. In the conductive film, the first optically anisotropic layer (H) was disposed on the polarizer side.

EXPLANATION OF REFERENCES 10, 110, 210: display device provided with touch panel
12, 24: polarizer
14A: first conductive layer for touch panel
14B: second conductive layer for touch panel
14C: third conductive layer for touch panel
16, 116: touch panel
18A, 18B: base for liquid crystal cell
20: liquid crystal layer
22: liquid crystal cell
30: first electrode
32: second electrode
34: first connecting portion
36: second connecting portion
38: insulating layer
40: lead-out wiring
42: pressure sensitive adhesive layer
50: first detection electrode
52: first lead-out wiring
54: second detection electrode
56: second lead-out wiring
60: λ/4 plate
70: organic EL display device
80, 180: organic EL display device provided with touch panel

What is claimed is:

1. A conductive film comprising:
   a polarizer;
   a conductive layer which is disposed directly on the polarizer and includes fullerene functionalized carbon nanotubes; and
   a hard coat layer which is disposed on the conductive layer.

2. The conductive film according to claim 1, wherein a sheet resistance value is in a range of 10 to 150 Ω/.

3. The conductive film according to claim 1, wherein a thickness of the polarizer is in a range of 5 to 30 μm.

4. The conductive film according to claim 2, wherein a thickness of the polarizer is in a range of 5 to 30 μm.

5. A conductive film comprising:
   a polarizer;
   a λ/4 plate;
   a conductive layer which is disposed directly on the λ/4 plate and includes fullerene functionalized carbon nanotubes; and
   a hard coat layer which is disposed on the conductive layer.

6. The conductive film according to claim 5, wherein a sheet resistance value is in a range of 10 to 150 Ω/.

7. The conductive film according to claim 5, wherein a thickness of the polarizer is in a range of 5 to 30 μm.

8. The conductive film according to claim 1, further comprising:
   a protective film which is disposed on a surface of the polarizer on the opposite side to the conductive layer side.

9. The conductive film according to claim 2, further comprising:
   a protective film which is disposed on a surface of the polarizer on the opposite side to the conductive layer side.

10. The conductive film according to claim 3, further comprising:
    a protective film which is disposed on a surface of the polarizer on the opposite side to the conductive layer side.

11. The conductive film according to claim 5, further comprising:
    a protective film which is disposed on a surface of the polarizer on the opposite side to the conductive layer side.

12. The conductive film according to claim 1, which is used for a touch panel.

13. The conductive film according to claim 2, which is used for a touch panel.

14. A display device provided with a touch panel comprising:
    the conductive film according to claim 12.

15. A display device provided with a touch panel comprising:
    the conductive film according to claim 13.

* * * * *